(12) United States Patent
Kang et al.

(10) Patent No.: US 9,691,902 B2
(45) Date of Patent: Jun. 27, 2017

(54) SEMICONDUCTOR DEVICE

(71) Applicant: Samsung Electronics Co., Ltd., Suwon-si, Gyeonggi-do (KR)

(72) Inventors: Myungil Kang, Suwon-si (KR); Yoonhae Kim, Suwon-si (KR); Byeongchan Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/990,398

(22) Filed: Jan. 7, 2016

(65) Prior Publication Data
US 2016/0322492 A1    Nov. 3, 2016

(30) Foreign Application Priority Data
Apr. 30, 2015    (KR) .................... 10-2015-0061707

(51) Int. Cl.
| H01L 29/78 | (2006.01) |
| H01L 29/417 | (2006.01) |
| H01L 27/092 | (2006.01) |
| H01L 29/423 | (2006.01) |

(52) U.S. Cl.
CPC ...... H01L 29/7848 (2013.01); H01L 27/0924 (2013.01); H01L 29/41725 (2013.01); H01L 29/4232 (2013.01); H01L 29/785 (2013.01)

(58) Field of Classification Search
CPC ............. H01L 29/66795; H01L 29/785; H01L 29/7851; H01L 27/0886; H01L 21/823431
USPC ......... 257/401, E21.409, 288, 347, E29.255, 257/330; 438/283, 270
See application file for complete search history.

(56) References Cited

U.S. PATENT DOCUMENTS

| 7,982,269 B2 | 7/2011 | Anderson et al. |
| 8,637,371 B2 | 1/2014 | Chang et al. |
| 2008/0237655 A1 | 10/2008 | Nakabayashi et al. |
| 2014/0252477 A1 | 9/2014 | Tseng et al. |
| 2014/0327046 A1 | 11/2014 | Huang et al. |
| 2015/0214341 A1* | 7/2015 | Shin ................ H01L 29/66818 257/401 |
| 2015/0279998 A1* | 10/2015 | Song ................ H01L 29/66795 257/330 |

* cited by examiner

*Primary Examiner* — David Vu
*Assistant Examiner* — Jonathan Han
(74) *Attorney, Agent, or Firm* — Lee & Morse, P.C.

(57) ABSTRACT

A semiconductor device includes a first pattern on a first active region, a second pattern on a second active region, and a third pattern on a third active region. The first pattern is spaced from the second pattern by a first interval corresponding to the width of a first recess between the first and second active regions. The second pattern is spaced from the third pattern by a second interval corresponding to the width of a second recess between the second and third active regions. The first, second, and third patterns includes gate patterns, and the first and second recesses include semiconductor material with a conductivity type different from the active regions. The semiconductor material in one recess extends higher than the semiconductor material in the other recess. The first, second, and third patterns have the same width, and the first and second recesses have different depths.

20 Claims, 31 Drawing Sheets

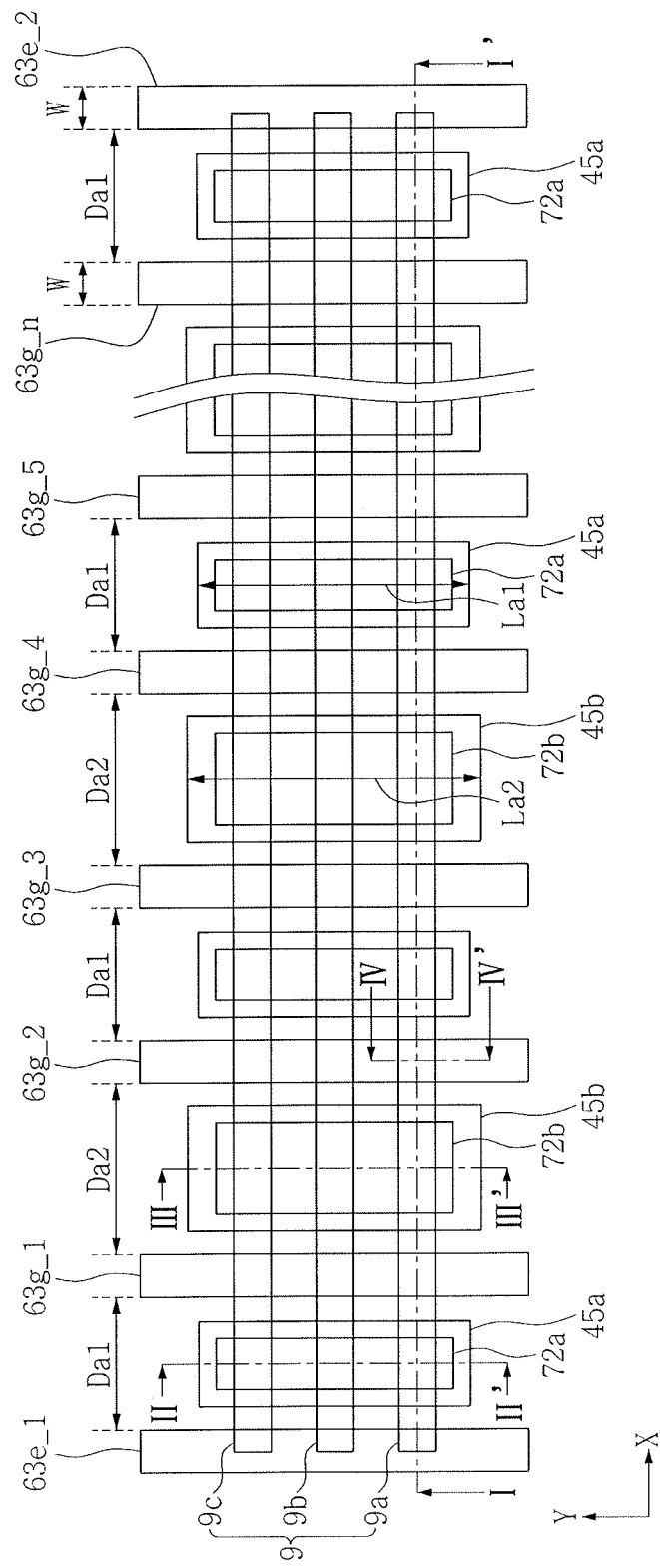

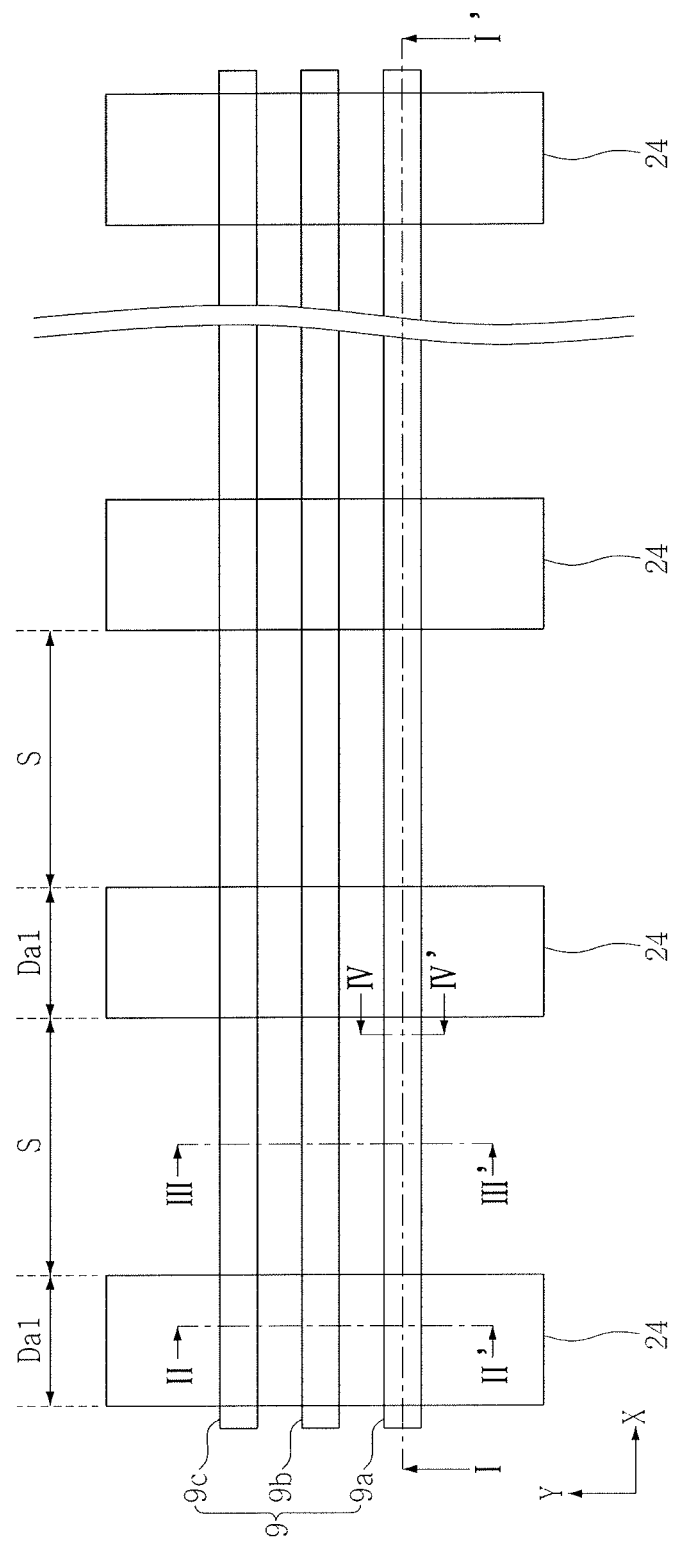

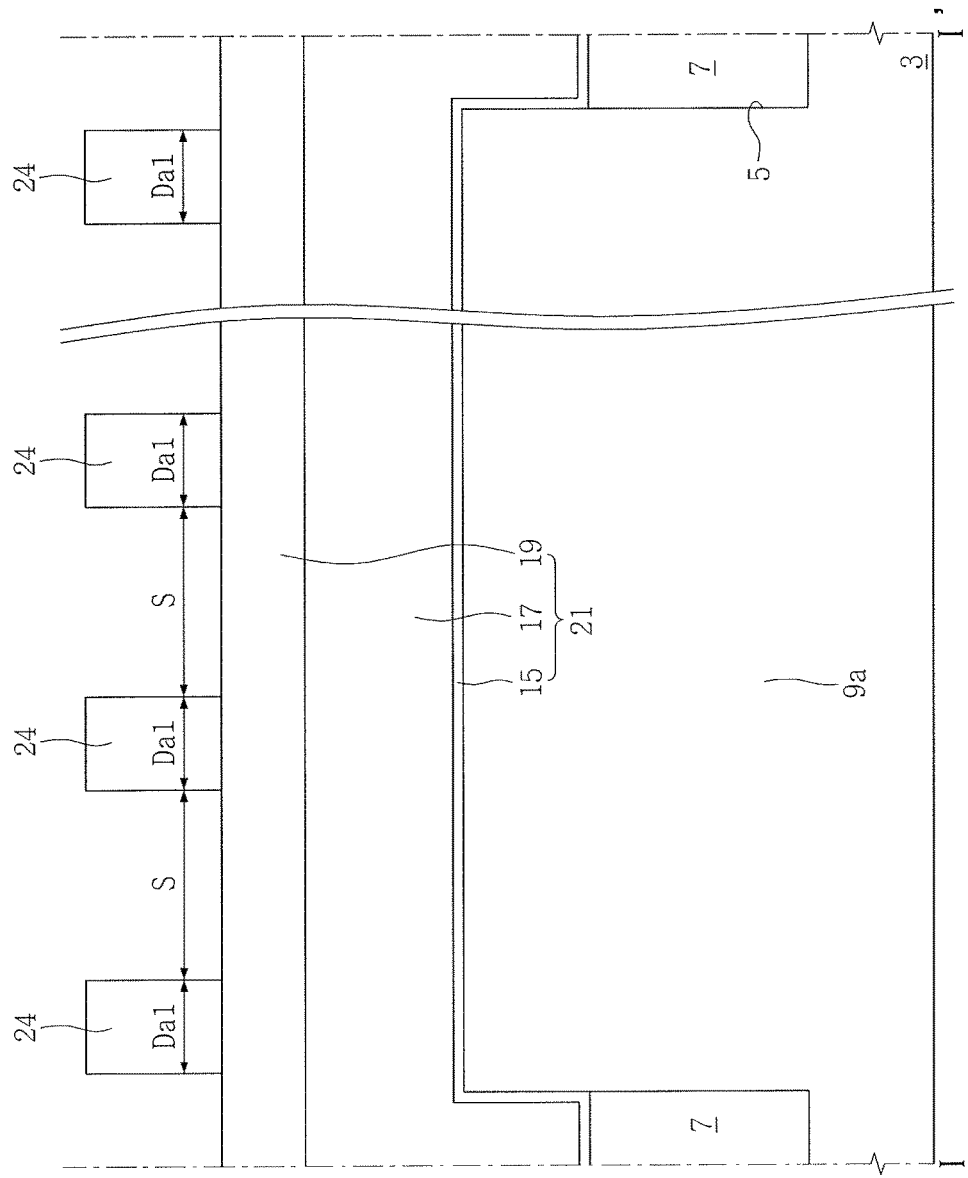

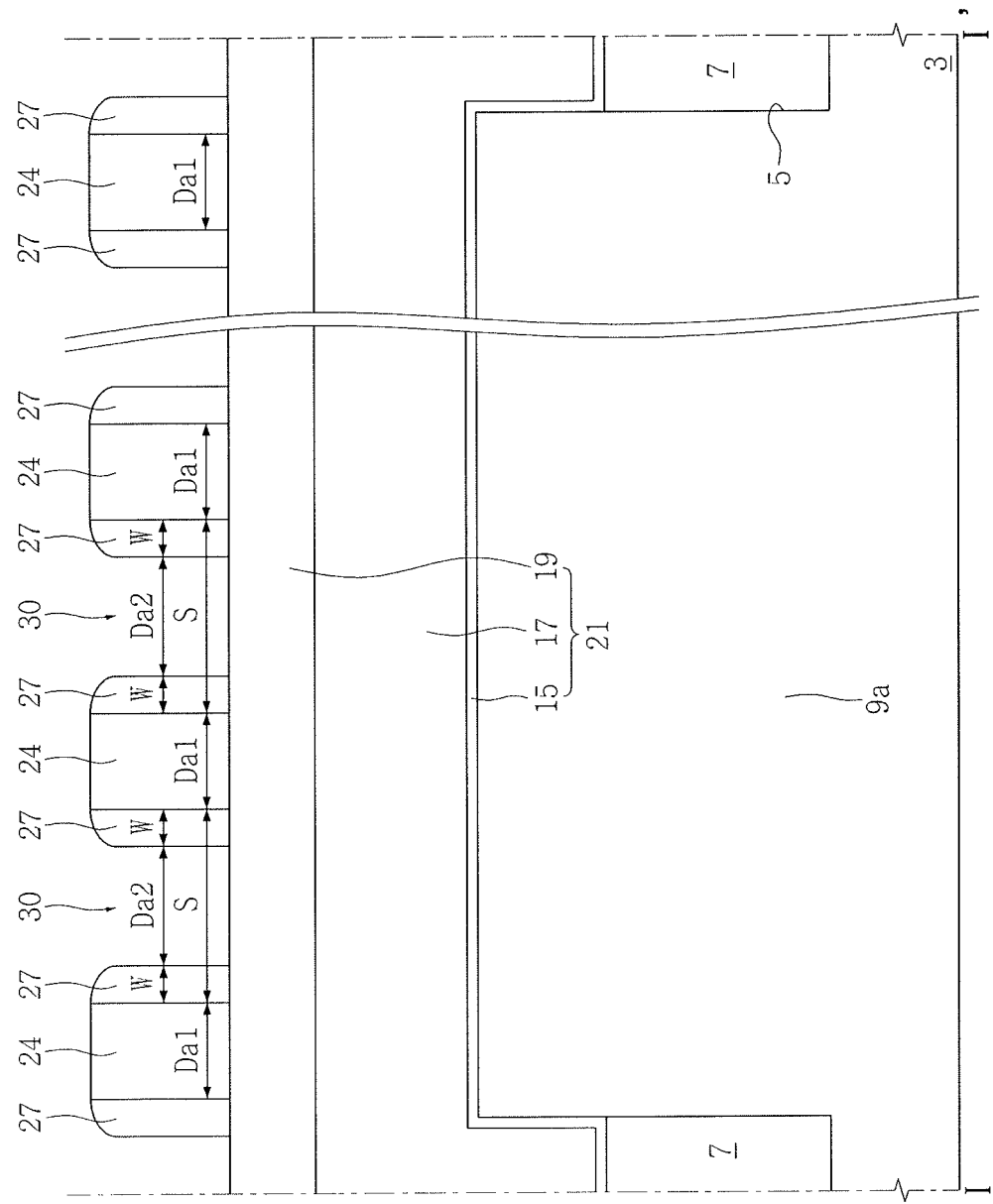

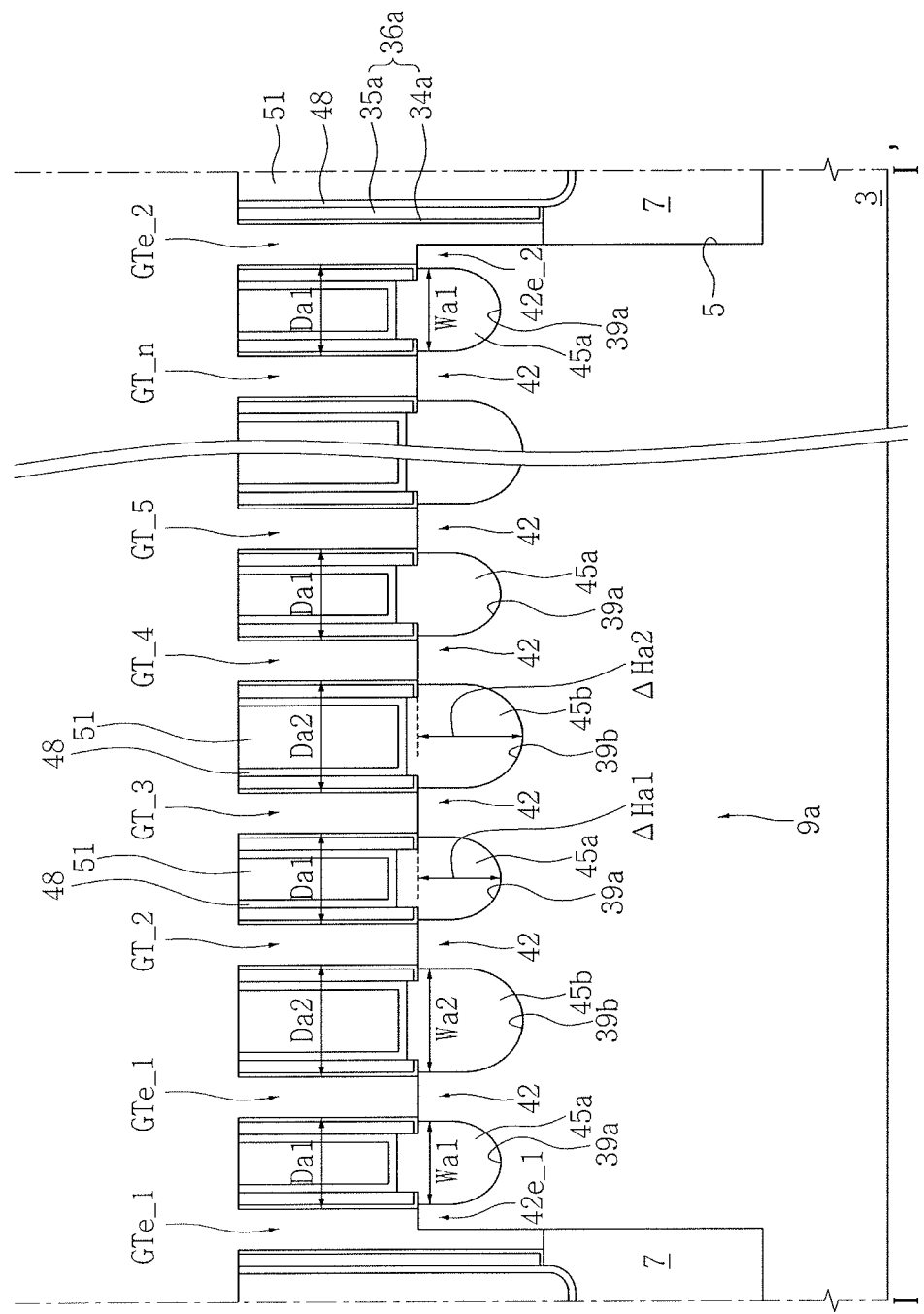

SEMICONDUCTOR DEVICE

CROSS-REFERENCE TO RELATED APPLICATION

Korean Patent Application No. 10-2015-0061707, filed on Apr. 30, 2015, and entitled, "Semiconductor Device," is incorporated by reference herein in its entirety.

BACKGROUND

1. Field

One or more embodiments described herein relate to a semiconductor device.

2. Description of Related Art

A transistor having finFET structure has been used in various types of integrated circuits. Recently, research has been conducted on forming an epitaxial layer on both sides of a channel region of a finFET transistor in order to increase carrier mobility in the channel region.

SUMMARY

In accordance with one or more embodiments, a semiconductor device includes an isolation region to define an active region in a semiconductor substrate, the active region including a plurality of protruding portions and a plurality of recessed areas; a plurality of patterns overlapping the plurality of protruding portions of the active region and having substantially a same width; and a plurality of semiconductor structures in the plurality of recessed areas. The plurality of recessed areas include first recessed areas in an odd-numbered sequence and second recessed areas in an even-numbered sequence. The first recessed areas and the second recessed areas are adjacent to each other and have different depths The plurality of semiconductor structures may include a first semiconductor structure and a second semiconductor structure which are adjacent to each other. A width of the first semiconductor structure may be less than a width of the second semiconductor structure; and the height difference between the bottom surface of the first semiconductor structure and the upper surface of at least one of the protruding portion may be less than the height difference between the bottom surface of the second semiconductor structure and the upper surface of at least one of the protruding portion.

The first and second semiconductor structures may overlap the isolation region. A first air gap may be between the first semiconductor structure and the isolation region; and a second air gap may be between the second semiconductor structure and the isolation region A length of the first semiconductor structure may be less than a length of the second semiconductor.

The plurality of semiconductor structures may be epitaxial layers having a conductivity type different from the active regions.

The protruding portions may include a first edge protruding portion, a second edge protruding portion, and a plurality of active protruding portions between the first and the second edge protruding portions. Widths of the first and the second edge protruding portions may be less than widths of the active protruding portions. The plurality of patterns may include a first edge pattern, a second edge pattern, and a plurality of gate patterns between the first and second edge patterns. The first edge pattern may overlap the first edge protruding portion; the second edge pattern may overlap the second edge protruding portion; and the plurality of gate patterns may overlap the active protruding portions. Widths of the first and the second edge patterns may be greater than widths of the first and the second edge protruding portions.

In accordance with one or more other embodiments, a semiconductor device includes an active region in a semiconductor substrate and including a plurality of protruding portions and a plurality of recessed areas; a plurality of patterns overlapping the protruding portions of the active region and having substantially a same width; and a plurality of semiconductor structures in the recessed areas, wherein: the recessed areas include a first recessed area and a second recessed area which are adjacent to each other and have different depths, and the plurality of semiconductor structures include a first semiconductor structure in the first recessed area and a second semiconductor structure in the second recessed area and having a different width from the first semiconductor structure. A depth of the second recessed area may be greater than a depth of the first recessed area. A width of the second recessed area may be greater than a width of the first recessed area.

The plurality of protruding portions may include a first edge protruding portion, a plurality of active protruding portions, and a second edge protruding portion, which are sequentially arranged in a first direction; and the plurality of patterns may include a first edge pattern overlapping the first edge protruding portion, a plurality of gate patterns overlapping the plurality of active protruding portions, and a second edge pattern overlapping the second edge pattern.

The first semiconductor structure may contact the first recessed area and fills the first recessed area; the second semiconductor structure may contact the second recessed area and may fill the second recessed area; and an upper surface of the first semiconductor structure may be at a different level from an upper surface of the second semiconductor structure.

In accordance with one or more other embodiments, a semiconductor device includes an isolation region in a semiconductor substrate; a plurality of active regions in the semiconductor substrate, the active regions passing through the isolation region and protruding to higher levels than an upper end of the isolation region, each of the active regions has a line shape extending in a first direction; a plurality of patterns crossing the active regions and having substantially a same width; and a plurality of semiconductor structures overlapping the active regions.

The active regions include a plurality of protruding portions and a plurality of recessed areas, the protruding portions including a first edge protruding portion, a plurality of active protruding portions, and a second edge protruding portion sequentially arranged in the first direction, the patterns including a first edge pattern overlapping the first edge protruding portion, a plurality of gate patterns overlapping the active protruding portions, and a second edge pattern overlapping the second edge protruding portion. The recessed areas include a first recessed area and a second recessed area having different depths, and the semiconductor structures include a first semiconductor structure in the first recessed area and a second semiconductor structure in the second recessed area.

The first recessed area may be adjacent to the second recessed area; a width of the first recessed area may be less than a width of the second recessed area; and a depth of the first recessed area may be less than a depth of the second recessed area. The first semiconductor structure may contact the active regions and has a first length; and the second semiconductor structure may contact the active regions and has a second length greater than the first length.

The semiconductor device may include a first air gap between the active regions under the first semiconductor structure; and a second air gap between the active regions and disposed under the second semiconductor structure. The semiconductor device may include a plurality of contact structures on the semiconductor structures; gate spacers between the contact structures and the patterns; and an insulating stopper layer between the gate spacers and the contact structures, wherein each of the gate spacers includes an inner spacer and an outer spacer, the inner spacer being closer to the patterns than the outer spacer.

In accordance with one or more other embodiments, a semiconductor device includes an isolation region in a semiconductor substrate; a plurality of active regions in the semiconductor substrate, the active regions passing through the isolation region and protruding to higher levels than an upper end of the isolation region, each of the active regions having a line shape extending in a first direction and each of the active regions including a plurality of protruding portions and a plurality of recessed areas, wherein: a plurality of patterns overlap the protruding portions of the active regions and have substantially a same width, a plurality of semiconductor structures overlap the active regions, the active regions include a plurality of protruding portions and a plurality of recessed areas, the protruding portions including a first edge protruding portion, a plurality of active protruding portions, and a second edge protruding portion sequentially arranged in the first direction, the patterns including a first edge pattern overlapping the first edge protruding portion, a plurality of gate patterns overlapping the plurality of active protruding portions, and a second edge pattern overlapping the second edge protruding portion, and the recessed areas are sequentially arranged in the first direction and include first recessed areas in an odd-numbered sequence and second recessed areas in an even-numbered sequence, depths of the second recessed areas different from depths of the first recessed areas.

The semiconductor structures may include first semiconductor structures in the first recessed areas and second semiconductor structures in the second recessed areas; and the first semiconductor structures may have upper surfaces at a different level from upper surfaces of the second semiconductor structures. Depths of the first recessed areas may be less than depths of the second recessed areas. Depths of the first recessed areas may be greater than depths of the second recessed areas.

The semiconductor device may include a plurality of contact structures on the semiconductor structures; silicide layers between the contact structures and the semiconductor structures; gate spacers between the contact structures and the patterns; first active spacers on side surfaces of the active regions under the first recessed areas; and second active spacers on side surfaces of the active regions under the second recessed areas.

In accordance with one or more other embodiments, a semiconductor device includes a first, second, and third active regions; a first pattern on the first active region; a second pattern on the second active region; and a third pattern on the third active region, wherein the first pattern is spaced from the second pattern by a first interval that substantially corresponds to a width of a first recess between the first and second active regions, and wherein the second pattern is spaced from the third pattern by a second interval that substantially corresponds to a width of a second recess between the second and third active regions, the first interval different from the second interval, wherein the first, second, and third patterns includes gate patterns, and wherein the first and second recesses include a semiconductor material having a conductivity type different from the first, second, and third active regions. The first, second, and third patterns may have substantially a same width. The first and second recesses may have different depths. The semiconductor material in one of the first or second recesses may extend higher than the semiconductor material in the other of the first or second recesses. The semiconductor device may include an isolation region, wherein upper surfaces of the first, second, and third active regions are above an upper surface of the isolation region.

BRIEF DESCRIPTION OF THE DRAWINGS

Features will become apparent to those of skill in the art by describing in detail exemplary embodiments with reference to the attached drawings in which:

FIG. 1 illustrates an embodiment of a semiconductor device;

FIGS. 5, 7, 9, 11 and 15 illustrate stages of an embodiment of a method for forming a semiconductor device;

FIGS. 6A, 6B, 8A, 8B, 10A, 10B, 12A, 12B, 13A, 13B, 14A, 14B, 16A, 16B, 17A, 17B, 18A, and 18B illustrate cross-sectional views corresponding to various stages of the method.

DETAILED DESCRIPTION

Figure 2A:
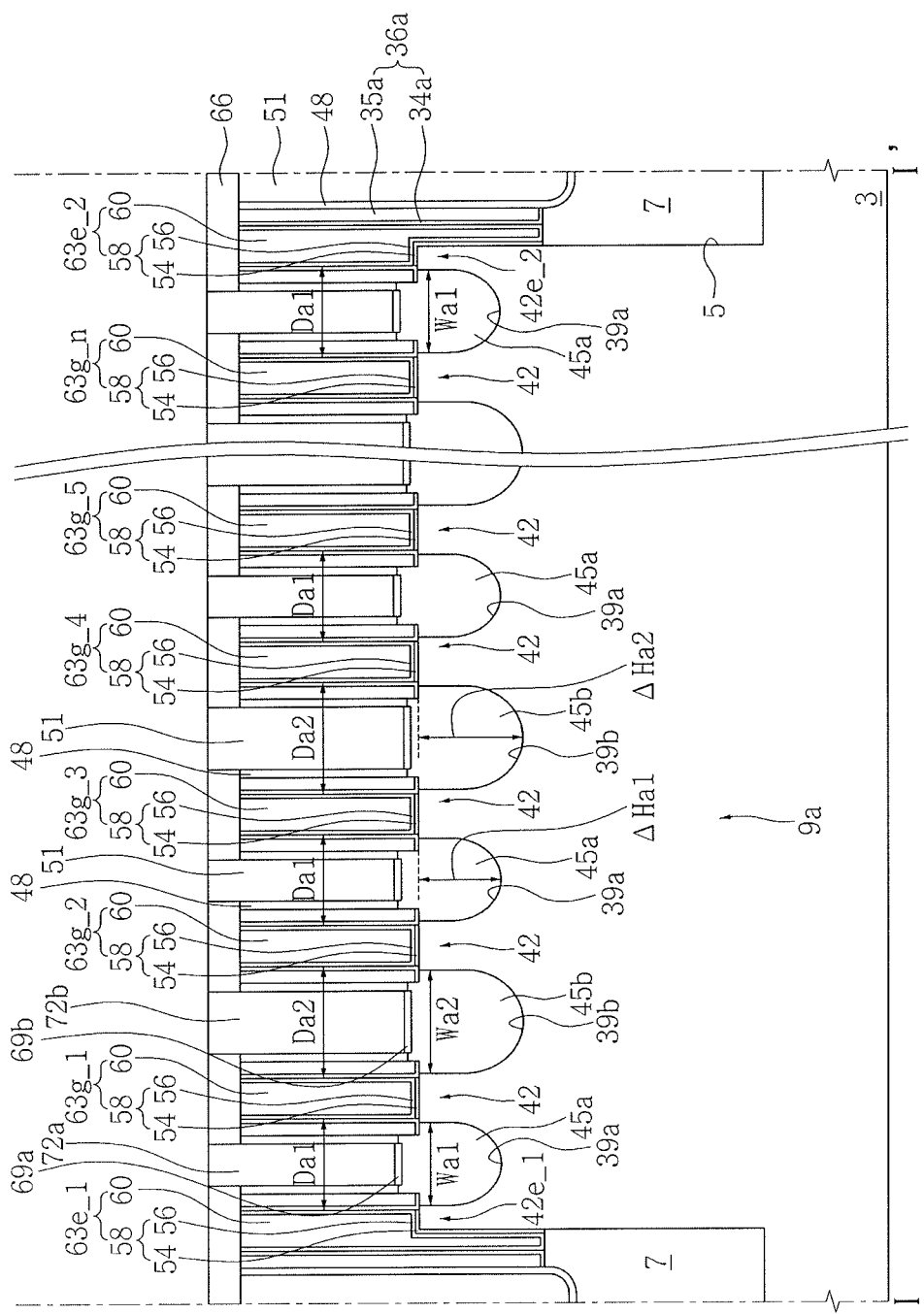
FIGS. 2A and 2B illustrate cross-sectional views of the semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The embodiments should not be limited to the embodiments set forth herein and may be construed as various embodiments in different forms. Rather, these embodiments are provided so that disclosure is thorough and complete, and fully conveys the embodiments to those of ordinary skill in the art. The embodiments are recited in the appended claims. The size and relative size of the layer and regions may be overstated for the clarity of description. Throughout the entire specification, the same reference numerals refer to the same components.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Embodiments are described herein with reference to cross-sectional views, views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the embodiments but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Throughout the entire specification, the term "air gap" may indicate a spacer having an empty space filled with no solid material. Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the embodiments.

Furthermore, throughout this disclosure, directional terms such as "upper," "intermediate," "lower," and the like may be used herein to describe the relationship of one element or feature with another, and the embodiments should not be limited by these terms. Accordingly, terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. For example, a "first element" could be termed as a "second element" without departing from the teachings of the present embodiments.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which the embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2B:
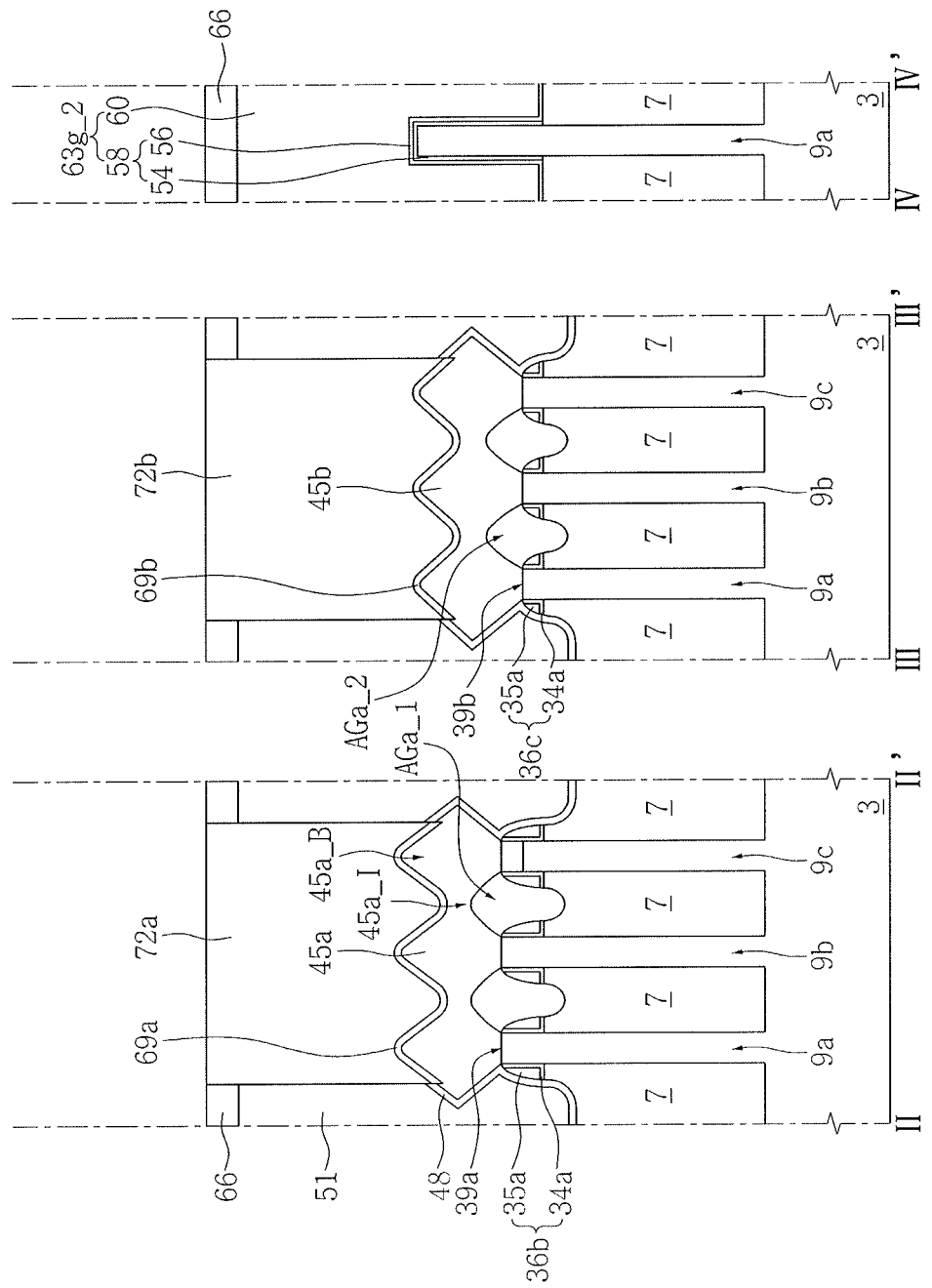

FIG. 1 illustrates an embodiment of a semiconductor device. FIG. 2A illustrates an example of a cross-section of the semiconductor device taken along line I-I' of FIG. 1. FIG. 2B illustrate examples of cross-sectional views of the semiconductor device taken along line II-II', line III-III', and line IV-IV' of FIG. 1.

Referring to FIGS. 1, 2A, and 2B, the semiconductor device includes a semiconductor substrate 3 formed of a semiconductor material, e.g., silicon. Isolation regions 7 may be in the semiconductor substrate 3. The isolation region 7 may include a device isolation trench 5 in the semiconductor substrate 3 and an insulating material layer (e.g., a silicon oxide layer) in the device isolation trench 5.

A plurality of active regions 9 may be in the semiconductor substrate 3. The active regions 9 may be defined by the isolation region 7 and may pass through the isolation region 7 and protrude to higher levels than an upper end of the isolation region 7. Each of the active regions 9 may have a predetermined (e.g., line) shape extending in a first direction (e.g., X direction). The active regions 9 may include a first active region 9a, a second active region 9b, and a third active region 9c parallel to each other and sequentially arranged in a second direction (e.g., Y direction) crossing the first direction (X direction).

Each of the active regions 9 may include a plurality of protruding portions $42e\_1$, 42, and $42e\_2$ and a plurality of recessed areas 39a and 39b, each between an adjacent pair of the protruding portions $42e\_1$, 42, and $42e\_2$, respectively. The protruding portions $42e\_1$, 42, and $42e\_2$ of the active regions 9 may include a first edge protruding portion $42e\_1$, a plurality of active protruding portions 42, and a second edge protruding portion $42e\_2$ sequentially arranged in the first direction (X direction). The active protruding portions 42 may have the same or different widths. In one embodiment, the active protruding portions 42 may have greater widths than the first and the second edge protruding portions $42e\_1$ and $42e\_2$.

The recessed areas 39a and 39b of the active regions 9 may be sequentially arranged in the first direction (X direction). The recessed areas 39a and 39b of the active regions 9 may include first recessed areas 39a and second recessed areas 39b between the first recessed areas 39a. The first recessed areas 39a and the second recessed areas 39b may be adjacent to each other. Among the recessed areas 39a and 39b sequentially arranged in the first direction (X direction), the first recessed areas 39a may be in an odd-numbered sequence and the second recessed areas 39b may be in an even-numbered sequence.

The first recessed areas 39a may have smaller widths and depths than the second recessed areas 39b. The first recessed areas 39a may have smaller depths than the second recessed areas 39b. Each of the first recessed areas 39a may have a first depth $\Delta Ha1$. Each of the second recessed areas 39b may include a second depth $\Delta Ha2$ having a greater depth than the first depth $\Delta Ha1$. The first depth $\Delta Ha1$ of each of the first recessed areas 39a may be a height difference between an upper end of one of the protruding portions of the active regions 9 and a bottom of one of the first recessed areas 39a. The second depth ΔHa2 of each of the second recessed areas 39b may be a height difference between an upper end of one of the protruding portions of the active regions 9 and a bottom of one of the second recessed areas 39b. Each of the first recessed areas 39a may include a first width Wa1. Each of the second recessed areas 39b may include a second width Wa2 greater than the first width Wa1.

A plurality of patterns 63e_1, 63g_1 to 63g_n, and 63e_2 are included to cross the active regions 9 and extend onto the isolation region 7. The patterns 63e_1, 63g_1 to 63g_n, and 63e_2 may overlap the active regions 9 and have the same width W. The patterns 63e_1, 63g_1 to 63g_n, and 63e_2 may overlap or face upper surfaces and side surfaces of portions of the active regions 9 protruding from the isolation region 7.

The patterns 63e_1, 63g_1 to 63g_n, and 63e_2 include a first edge pattern 63e_1, a plurality of gate patterns 63g_1 to 63g_n, and a second edge pattern 63e_2 sequentially arranged in the first direction (X direction). The gate patterns 63g_1 to 63g_n may be between the first and the second edge patterns 63e_1 and 63e_2. The gate patterns 63g_1 to 63g_n may be any number n, where n is a positive integer. In one embodiment, n is an even number.

The patterns 63e_1, 63g_1 to 63g_n, and 63e_2 may include patterns spaced apart by a first interval Da1 and patterns spaced apart by a second interval Da2, which is greater than the first interval Da1. The first edge pattern 63e_1 may be spaced apart from the gate patterns 63g_1 to 63g_n by the first interval Da1. The second edge pattern 63e_2 may be spaced apart from the gate patterns 63g_1 to 63g_n by first interval Da1.

Among the gate patterns 63g_1 to 63g_n, odd-numbered gate patterns and even-numbered gate patterns, which are sequentially disposed after the odd-numbered gate patterns, may be spaced apart by the second interval Da2. Among the gate patterns 63g_1 to 63g_n, the even-numbered gate patterns and the odd-numbered gate patterns, which are sequentially disposed after the even-numbered gate patterns, may be spaced apart by the first interval Da1. For example, among the gate patterns 63g_1 to 63g_n, a first gate pattern 63g_1 and a second gate pattern 63g_2 may be spaced apart by the second interval Da2, and a third gate pattern 63g_3 and a fourth gate pattern 63g_4 may be spaced apart by the second interval Da2. Among the gate patterns 63g_1 to 63g_n, the second gate pattern 63g_2 and the third gate pattern 63g_3 may be spaced apart by the first interval Da1, and the fourth gate pattern 63g_4 and a fifth gate pattern 63g_5 may be spaced apart by the first interval Da1.

In the drawings, six gate patterns 64g_1 to 63g_n are illustrated. Two patterns, four patterns, or a different number of gate patterns 63g_1 to 63g_n may exist in another embodiment.

The first edge pattern 63e_1 may overlap the first edge protruding portion 42e_1. The second edge pattern 63e_2 may overlap the second edge protruding portion 42e_2. The gate patterns 63g_1 to 63g_n may overlap active protruding portions 42.

The first and the second edge patterns 63e_1 and 63e_2 may have greater widths than the first and the second edge protruding portions 42e_1 and 42e_2. The first edge pattern 63e_1 may cover an upper surface of the first edge protruding portion 42e_1 and the isolation region 7 located on extensions of the active regions 9 having line shapes. The second edge pattern 63e_2 may cover an upper surface of the second edge protruding portion 42e_2 and the isolation region 7 located on an extension of the active regions 9 having the line shapes.

Each of the patterns 63e_1, 63g_1 to 63g_n, and 63e_2 may include a conductive pattern 60 and a gate dielectric 58 on side surfaces and a bottom surface of the conductive pattern 60. The gate dielectric 58 may include a first gate dielectric 54 and a second gate dielectric 56. The first gate dielectric 54 may be formed, for example, by oxidizing the active regions 9. The second gate dielectric 56 may be formed, for example, by a vapor deposition process. For example, the first gate dielectric 54 may include silicon oxide and the second gate dielectric 56 may include a metal oxide having a greater dielectric constant than the silicon oxide.

The conductive pattern 60 may be a gate electrode. For example, the conductive pattern 60 may include a first conductive material and a second conductive material. The first conductive material may include a barrier conductive material, e.g., titanium (Ti), titanium nitride (TiN), tantalum (Ta), tantalum nitride (TaN), or the like. The second conductive material may include a metal such as tungsten (W), an alloy, or a metal compound.

A plurality of semiconductor structures 45a and 45b may be in the recessed areas 39a and 39b. The semiconductor structures 45a and 45b may have a conductivity type different from the active regions 9. The semiconductor structures 45a and 45b may be sources/drains of transistors. The semiconductor structures 45a and 45b may be epitaxial layers. The semiconductor structures 45a and 45b may be formed of a different material from the active regions 9 or a material having a composition ratio different from the active regions 9. For example, the semiconductor structures 45a and 45b may include a material such as silicon germanium, and the active regions 9 may include a material such as silicon.

The semiconductor structures 45a and 45b may include first semiconductor structures 45a in the first recessed areas 39a and second semiconductor structures 45b in the second recessed areas 39b.

The first semiconductor structures 45a may be in contact with the active regions 9 by filling the first recessed areas 39a. The second semiconductor structures 45b may be in contact with the active regions 9 by filling the second recessed areas 39b. Upper surfaces of the first semiconductor structures 45a may be at higher levels than upper surfaces of the active protruding portions 42. The second semiconductor structures 45b may fill the second recessed areas 39b. Upper surfaces of the second semiconductor structures 45b may be at higher levels than the upper surfaces of the active protruding portions 42.

The first semiconductor structures 45a may have upper surfaces at different levels from the second semiconductor structures 45b. The upper surfaces of the first semiconductor structures 45a may not be at the same level as the upper surfaces of the second semiconductor structures 45b. The first semiconductor structures 45a may have upper surfaces at higher levels than the upper surfaces of the second semiconductor structures 45b.

In a plan view, each of the first semiconductor structures 45a may have a long shape or a bar shape and may contact and overlap the active regions 9. For example, each of the first semiconductor structures 45a may overlap the first to third active regions 9a, 9b, and 9c. In another embodiment, the first semiconductor structures 45a may have a different shape.

In a plan view, each of the second semiconductor structures 45b may have a long shape or a bar shape and may contact and overlap the active regions 9. For example, each of the second semiconductor structures 45b may overlap the first to third active regions 9a, 9b, and 9c. In another embodiment, the second semiconductor structures 45b may have a different shape.

In one embodiment, the first semiconductor structures 45a may have shapes having widths and lengths less than those of the second semiconductor structures 45b. The first semiconductor structures 45a may have horizontal widths and vertical lengths less than the second semiconductor structures 45b. Widths Wa1 of the first semiconductor structures 45a in the first direction (X direction) may be less than widths Wa2 of the second semiconductor structures 45b in the first direction (X direction). Lengths La1 of the first semiconductor structures 45a in the second direction (Y direction) may be less than lengths La2 of the second semiconductor structures 45b in the second direction (Y direction).

Height differences ΔHa1 between bottom surfaces of the first semiconductor structures 45a and upper surfaces of the protruding portions 42e_1, 42, and 42e_2 of the active regions 9 may be different from height differences ΔHa2 between bottom surfaces of the second semiconductor structures 45b and upper surfaces of the protruding portions 42e_1, 42, and 42e_2 of the active regions 9. The height differences ΔHa1 between the bottom surfaces of the first semiconductor structures 45a and the upper surfaces of the protruding portions 42e_1, 42, and 42e_2 of the active regions 9 may be less than the height differences ΔHa2 between the bottom surfaces of the second semiconductor structures 45b and the upper surfaces of the protruding portions 42e_1, 42, and 42e_2 of the active regions 9.

The first and second semiconductor structures 45a and 45b may overlap the isolation regions 7 and the active regions 9. A plurality of first air gaps AGa1 may be between the first semiconductor structures 45a and the isolation regions 7 located between the active regions 9. A plurality of second air gaps AGa2 may be between the first semiconductor structures 45b and the isolation regions 7 located between the active regions 9. The first and the second air gaps AGa1 and AGa2 may be empty spaces.

Gate spacers 36a may be on side surfaces of the patterns 63e_1, 63g_1 to 63g_n, and 63e_2. First active spacers 36b may be on side surfaces of the active regions 9 under the first recessed areas 39a. Second active spacers 36c may be on side surfaces of the active regions 9 under the second recessed areas 39b.

Each of the gate spacers 36a, the first active spacers 36b, and the second active spacers 36c may include an inner spacer 34a and an outer spacer 35a. The inner spacer 34a may have a smaller thickness than the outer spacer 35a. The inner spacer 34a may be formed of a material having an etch selectivity with respect to the outer spacer 35a. For example, the inner spacer 34a may include an insulating nitride (e.g., SiN), and the outer spacer 35a may be formed of an insulating oxide (e.g., SiO) or an insulating oxide having carbon (e.g., SiOC).

The inner spacers 34a of the gate spacers 36a may be between the outer spacers 35a and the patterns 63e_1, 63g_1 to 63g_n, and 63e_2 and may extend to bottom surfaces of the outer spacers 35a.

An insulating stopper layer 48 and a lower interlayer insulating layer 51 may be on a substrate having the patterns 63e_1, 63g_1 to 63g_n, and 63e_2, the spacers 36a, 36b, and 36c, and the semiconductor structures 45a and 45b. The insulating stopper layer 48 may be conformally formed. The lower interlayer insulating layer 51 may be formed on the insulating stopper layer 48 and may not overlap upper surfaces of the patterns 63e_1, 63g_1 to 63g_n, and 63e_2.

An upper interlayer insulating layer 66 may be on the plurality of patterns 63e_1, 63g_1 to 63g_n, and 63e_2 and the lower interlayer insulating layer 51 The lower and upper interlayer insulating layers 51 and 66 and a plurality of contact structures 72a and 72b, configured to pass through the insulating stopper layer 48, may be on the semiconductor structures 45a and 45b.

The contact structures 72a and 72b may include first contact structures 72a on the first semiconductor structures 45a and second contact structures 72b on the second semiconductor structures 45b. Each of the first and the second contact structures 72a and 72b may be formed of a conductive material (e.g., metal nitride) and/or a metal material.

First silicide layers 69a may be between the first semiconductor structures 45a and the first contact structures 72a. Second silicide layers 69b may be between the second semiconductor structures 45b and the second contact structures 72b.

The gate spacers 36a may be between the contact structures 72a and 72b and the patterns 63e_1, 63g_1 to 63g_n, and 63e_2, and may extend between the patterns 63e_1, 63g_1 to 63g_n, and 63e_2 and the semiconductor structures 45a and 45b. Insulating stopper layers 48 may be between gate spacers 36a and contact structures 72a and 72b.

In one embodiment, transistors including finFET structures having the gate patterns 63g_1 to 63g_n and the semiconductor structures 45a and 45b are provided. The semiconductor structures 45a and 45b may serve as sources or drains of transistors. In a transistor having a finFET structure, transistor channel regions may be defined in the active protruding portions 42 of the active regions 9.

Among the semiconductor structures 45a and 45b, adjacent semiconductor structures may be disposed to have an asymmetric structure. Because the semiconductor structures 45a and 45b serve as a source or a drain, a transistor including a finFET structure having an asymmetric source/drain may therefore be provided.

In one embodiment, the semiconductor structures 45a and 45b are formed of a material having a different composition ratio from the active regions 9 or a different material from the active regions 9, and may serve as a stressor for stressing the active protruding portions 42 of the active regions 9. Thus, the semiconductor structures 45a and 45b may serve to improve carrier mobility characteristics in transistor channel regions in the active protruding portions 42. As a result, a semiconductor device adopting a transistor having a finFET structure may be provided with improved carrier mobility characteristics.

Figure 3:
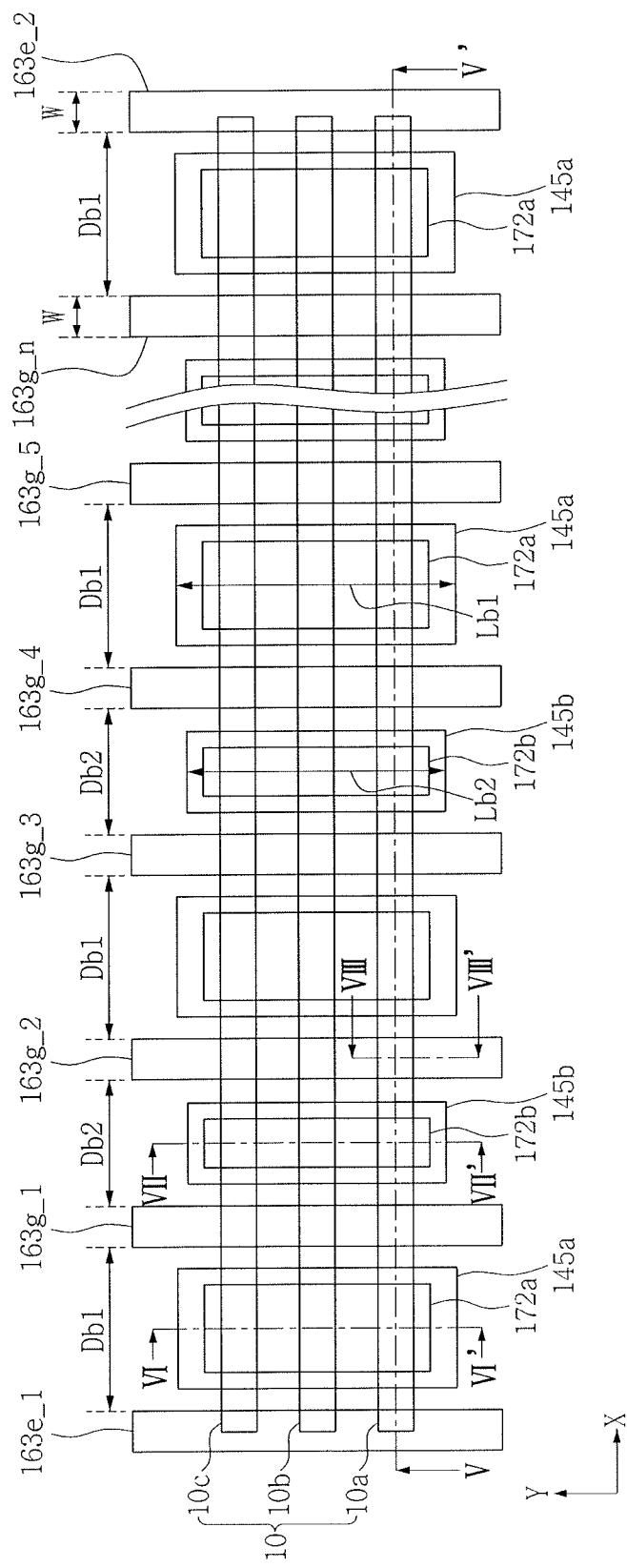
FIG. 3 illustrates an embodiment of a semiconductor device.
Figure 4A:
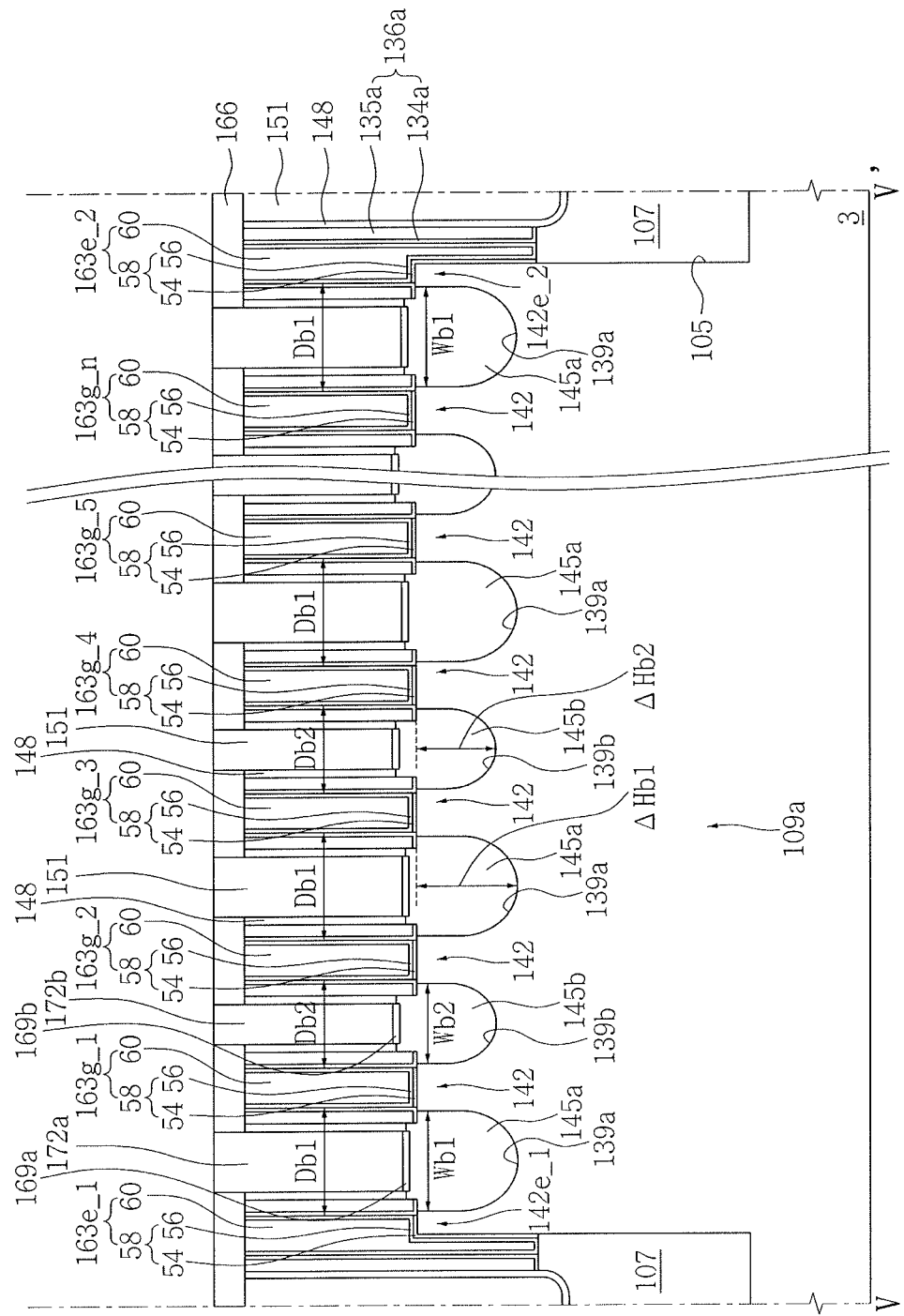
FIGS. 4A and 4B illustrate cross-sections of the semiconductor device in FIG. 3.
Figure 4B:
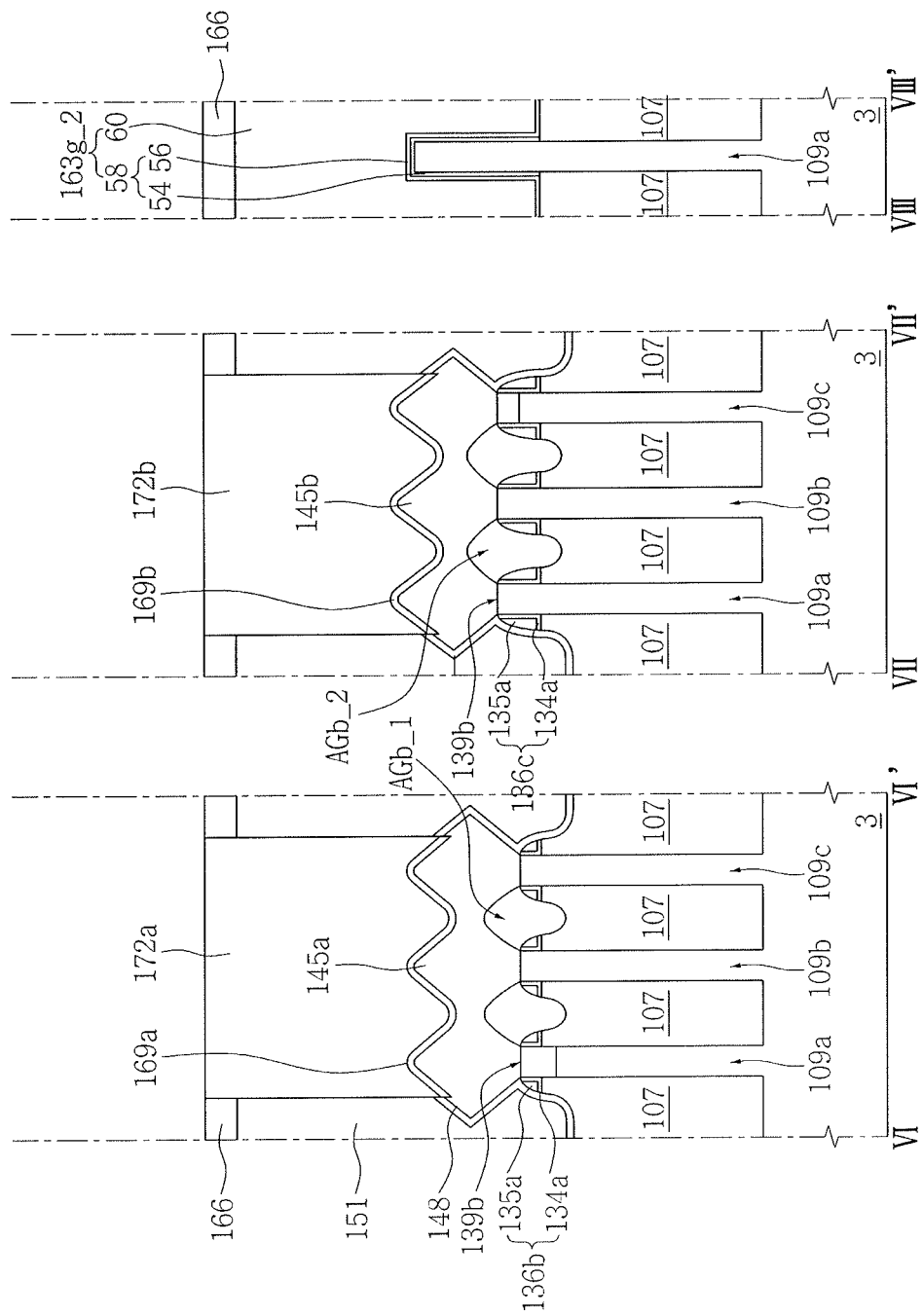

FIG. 3 illustrates another embodiment of a semiconductor device. FIG. 4A is a cross-sectional view taken along line V-V'. FIG. 4B is a cross-sectional view taken along line VI-VI', line VII-VII', and line VIII-VIII' in FIG. 3.

Referring to FIGS. 3, 4A, and 4B, an isolation region 107 is included to define a plurality of active regions 109. The isolation region 107 may include a device isolation trench 105 in the semiconductor substrate 3 and an insulating material layer (e.g., a silicon oxide layer) in the device isolation trench 105. The active regions 109 may pass through the isolation region 107 and protrude to higher levels than an upper end of the isolation region 107.

Each of the active regions 109 may have a predetermined (e.g., line) shape extending in a first direction (e.g., X direction). The active regions 109 include a first active region 109a, a second active region 109b, and a third active region 109c parallel to each other and sequentially arranged in a second direction (e.g., Y direction) crossing the first direction.

Each of the active regions 109 may include a plurality of protruding portions and a plurality of recessed areas disposed between the plurality of protruding portions.

The protruding portions of the active regions 109 include a first edge protruding portion 142e_1, a plurality of active protruding portions 142, and a second edge protruding portion 142e_2 sequentially arranged in the first direction (X direction). The active protruding portions 142 may have the same or different width, and may have greater widths than the first and second edge protruding portions 142e_1 and 142e_2.

The recessed areas of the active regions 109 may be sequentially arranged in the first direction (X direction). The recessed areas sequentially arranged in the first direction (X direction) may include first recessed areas 139a in an odd-numbered sequence and second recessed areas 139b in an even-numbered sequence. Widths Wb1 of the first recessed areas 139a may be greater than widths Wb2 of than the second recessed areas 139b. Depths ΔHb1 of the first recessed areas 139a may be greater than depths ΔHb2 of the second recessed areas 139b.

A plurality of patterns may cross the active regions 109 and extend onto the isolation region 107. The patterns may overlap the active regions 109 and may have the same width W. The patterns may include a first edge pattern 163e_1, a plurality of gate patterns 163g_1 to 163g n, and a second edge pattern 163e_2 sequentially arranged in the first direction (X direction). The gate patterns 163g_1 to 163g_n may be between the first and second edge patterns 163e_1 and 163e_2. The gate patterns 163g_1 to 163g_n be in any n, where n is a positive integer. In one embodiment, n is an even number.

The patterns may include patterns spaced apart by a first interval Db1 and patterns spaced apart by a second interval Db2, which is less than the first interval Db1. The first edge pattern 163e_1 may be spaced apart from the gate patterns 163g_1 to 163g_n by the first interval Db1. The second edge pattern 163e_2 may be spaced apart from the plurality of gate patterns 163g_1 to 163g_n by the first interval Db1.

Among the gate patterns 163g_1 to 163g_n, intervals between odd-numbered gate patterns and even-numbered gate patterns, which are sequentially disposed after the odd-numbered gate patterns, may be spaced apart by the second interval Db2. Among the gate patterns 163g_1 to 163g_n, spaces between the even-numbered gate patterns and the odd-numbered gate patterns, which are sequentially disposed after the even-numbered gate patterns, may be spaced apart by the first interval Db1. For example, among the gate patterns 163g_1 to 163g_n, a first gate pattern 163g_1 and a second gate pattern 163g_2 may be spaced apart by the second interval Db2, and a third gate pattern 163g_3 and a fourth gate pattern 163g_4 may be spaced apart by the second interval Db2. Among the gate patterns 163g_1 to 163g_n, the second gate pattern 163g_2 and the third gate pattern 163g_3 may be spaced apart by the first interval Db1, and the fourth gate pattern 163g_4 and a fifth gate pattern 163g_5 may be spaced apart by the first interval Db1.

The first edge pattern 163e_1 may overlap the first edge protruding portion 142e_1. The second edge pattern 163e_2 may overlap the second edge protruding portion 142e_2. The gate patterns 163g_1 to 163g_n may overlap the active protruding portions 142. Similar to FIGS. 1, 2a, and 2b, each of the patterns may include a conductive pattern 60 and a gate dielectric 58 on side surfaces and a bottom surface of the conductive pattern 60.

A plurality of semiconductor structures 145a and 145b may be in the plurality of recessed areas 139a and 139b. The semiconductor structures 145a and 145b may have a different conductivity type from the active regions 109. The semiconductor structures 145a and 145b may be sources/drains of transistors. The semiconductor structures 145a and 145b may be epitaxial layers. The semiconductor structures 145a and 145b may be formed of a different material from the active regions 109 or a material having a composition ratio different from the active regions 109.

The semiconductor structures 145a and 145b may include first semiconductor structures 145a in the first recessed areas 139a and second semiconductor structures 145b in the second recessed areas 139b.

The first semiconductor structures 145a may fill the first recessed areas 139a. The second semiconductor structures 145b may fill the second recessed areas 139b. Upper surfaces of the first semiconductor structures 145a may be at higher levels than upper surfaces of the active protruding portions 142.

The second semiconductor structures 145b may fill the second recessed areas 139b. Upper surfaces of the second semiconductor structures 145b may be at higher levels than upper surfaces of the active protruding portions 142.

Each of the first semiconductor structures 145a has a predetermined (e.g., bar) shape overlapping the active regions 109. For example, each of the first semiconductor structures 145a may overlap the first to third active regions 109a, 109b, and 109c. Each of the second semiconductor structures 145b has predetermined (e.g., bar) shape overlapping the active regions 109. For example, each of the second semiconductor structures 145b may overlap the first to third active regions 109a, 109b, and 109c.

The first semiconductor structures 145a may have shapes with widths and lengths greater than those of the second semiconductor structures 145b. The first semiconductor structures 145a may have greater horizontal widths and vertical lengths than the second semiconductor structures 145b. Widths Wb1 of the first semiconductor structures 145a in the first direction (X direction) may be greater than widths Wb2 of the second semiconductor structures 145b in the first direction (X direction). Lengths Lb1 of the first semiconductor structures 145a in the second direction (Y direction) may be greater than lengths Lb2 of the second semiconductor structures 145b in the second direction (Y direction). Height differences ΔHb1 between bottom surfaces of the first semiconductor structures 145a and upper surfaces of the protruding portions 142e_1, 142, and 142e_2 of the active regions 109 may be greater than height differences ΔHb2 between bottom surfaces of the second semiconductor structures 145b and the upper surfaces of the protruding portions 142e_1, 142, and 142e_2 of the active regions 109.

A plurality of first air gaps AGb1 may be between the first semiconductor structures 145a and the isolation region 107 located between the active regions 109. A plurality of second air gaps AGb2 may be between the first semiconductor structures 145b and the isolation region 107 located between the active regions 109.

First contact structures 172a may be on the first semiconductor structures 145a. Second contact structures 172b may be on the second semiconductor structures 145b. Each of the first and second contact structures 172a and 172b may be formed of a conductive material (e.g., metal nitride) and/or a metal material.

First silicide layers 169a may be between the first semiconductor structures 145a and the first contact structures 172a. Second silicide layers 169b may be between the second semiconductor structures 145b and the second contact structures 172b.

Gate spacers 136a may be on side surfaces of the patterns 163e_1, 163g_1 to 163g_n, and 163e_2. First active spacers 136b may be on side surfaces of the active regions 109 under the first recessed areas 139a. Second active spacers 136c may be on side surfaces of the active regions 109 under the second recessed areas 139b.

Each of the gate spacers 136a, the first active spacers 136b, and the second active spacers 136c may include an inner spacer 134a and an outer spacer 135a. The inner spacers 134a of the gate spacers 136a may be between the outer spacers 135a and the patterns 163e_1, 163g_1 to 163g_n, and 163e_2 and may extend to bottom surfaces of the outer spacers 135a.

An insulating stopper layer 148 and a lower interlayer insulating layer 151 may be on a substrate having the patterns 163e_1, 163g_1 to 163g_n, and 163e_2, the spacers 136a, 136b, and 136c, and the semiconductor structures 145a and 145b. The insulating stopper layer 148 may be conformally formed. The lower interlayer insulating layer 151 may be formed on the insulating stopper layer 148 and may not overlap upper surfaces of the patterns 163e_1, 163g_1 to 163g_n, and 163e_2.

The lower and upper interlayer insulating layers 151 and 166 and a plurality of contact structures 172a and 172b passing through the insulating stopper layer 148 may be on the semiconductor structures 145a and 145b.

The contact structures 172a and 172b may include first contact structures 172a on the first semiconductor structures 145a and second contact structures 172b on the second semiconductor structures 145b. Each of the first and second contact structures 172a and 172b may be formed of a conductive material (e.g., metal nitride) and/or a metal material.

First silicide layers 169a may be between the first semiconductor structures 145a and the first contact structures 172a. Second silicide layers 169b may be between the second semiconductor structures 145b and the second contact structures 172b.

The gate spacers 136a may be between the contact structures 172a and 172b and the patterns 163e_1, 163g_1 to 163g_n, and 163e_2 and may extend between the patterns 163e_1, 163g_1 to 163g_n, and 163e_2 and the semiconductor structures 145a and 145b. Insulating stopper layers 148 may be between the gate spacers 136a and the contact structures 172a and 172b.

FIGS. 5 to 18B illustrate embodiments of a method for forming semiconductor devices. FIGS. 5, 7, 9, 11 and 15 are plan views illustrating various stages of the method embodiments. FIGS. 6A, 6B, 8A, 8B, 10A, 10B, 12A, 12B, 13A, 13B, 14A, 14B, 16A, 16B, 17A, 17B, 18A, and 18B are cross-sectional views illustrating various stages of the method embodiments.

Figure 6B:
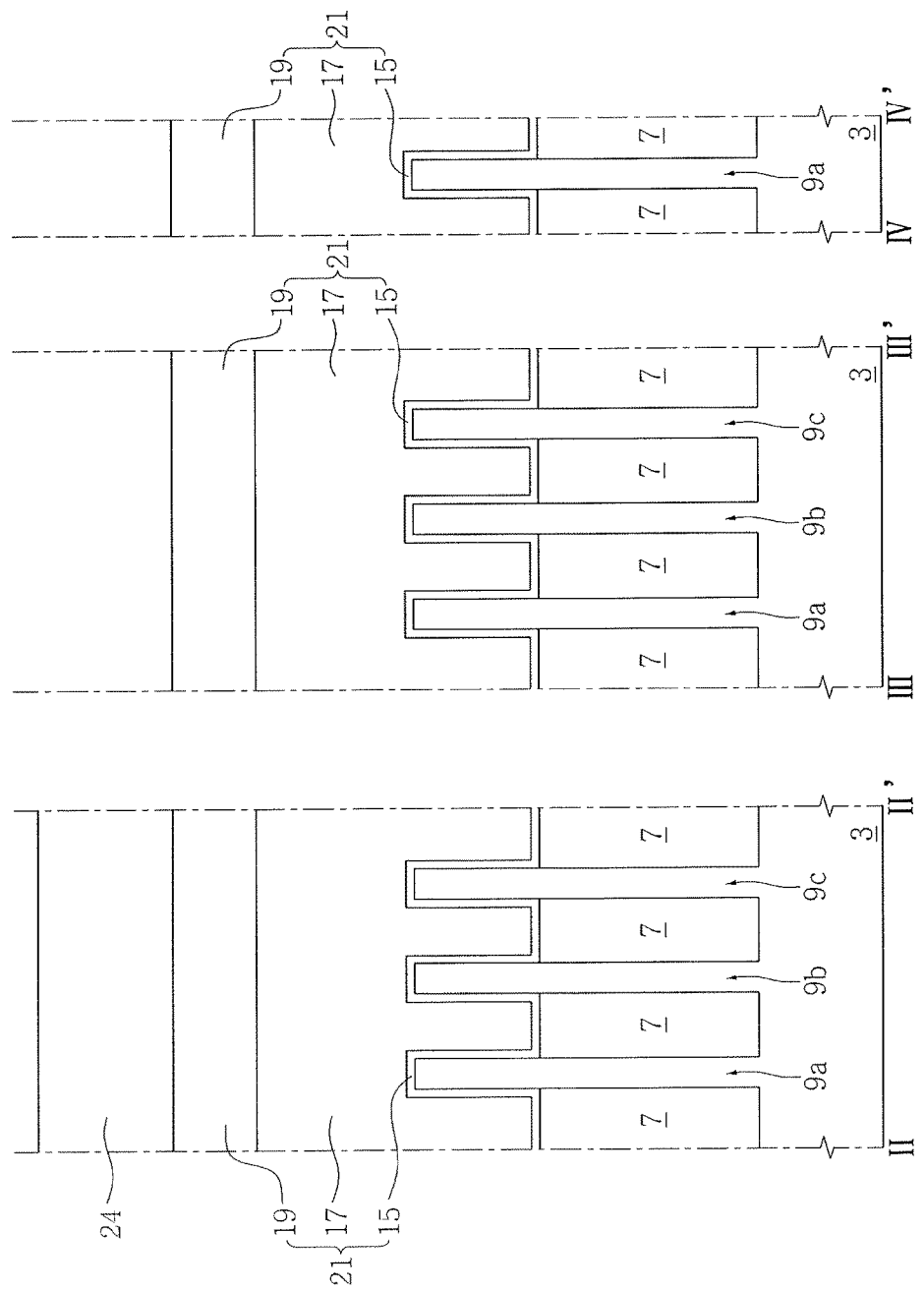
Figure 7:
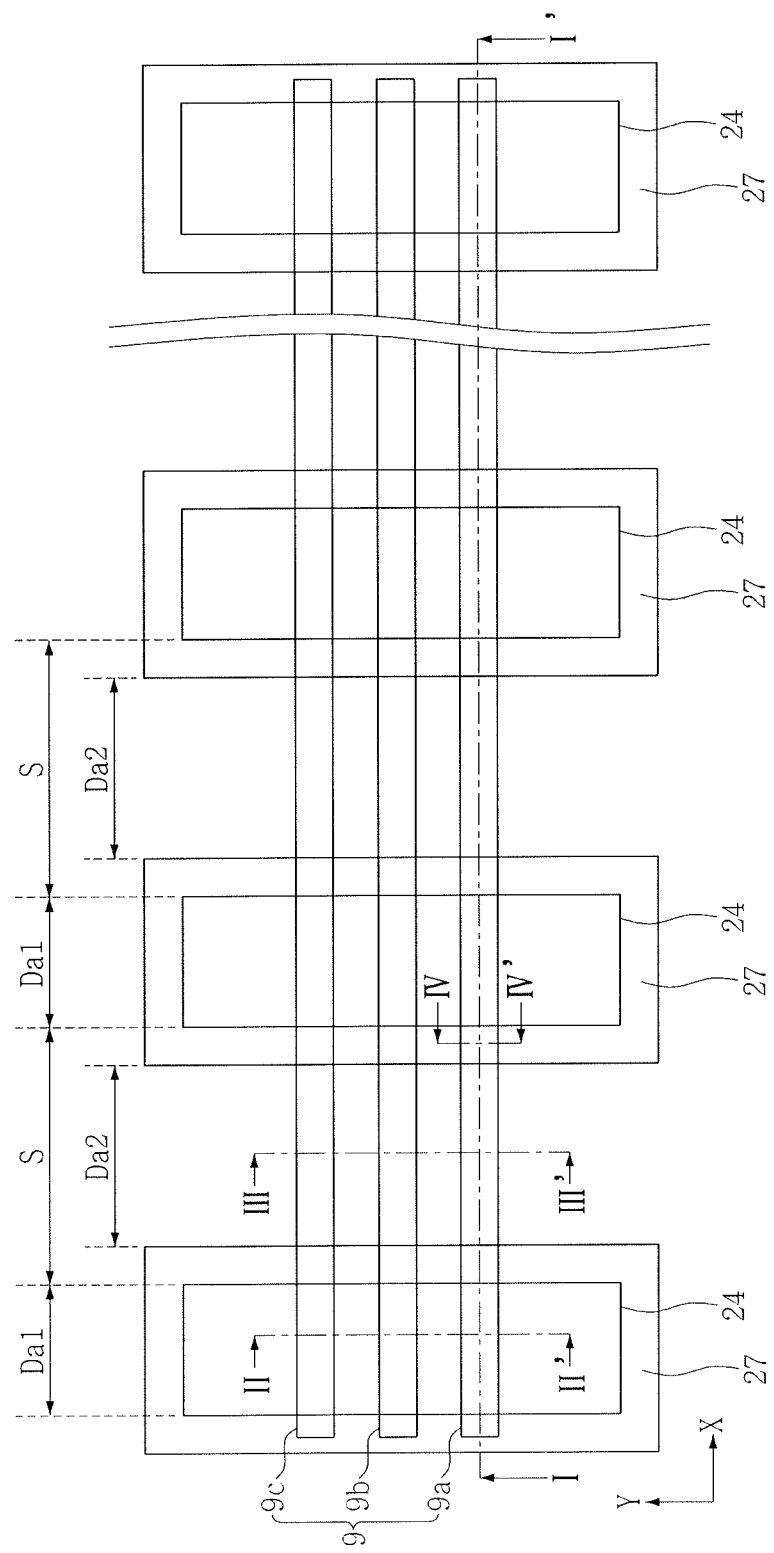
Figure 8B:
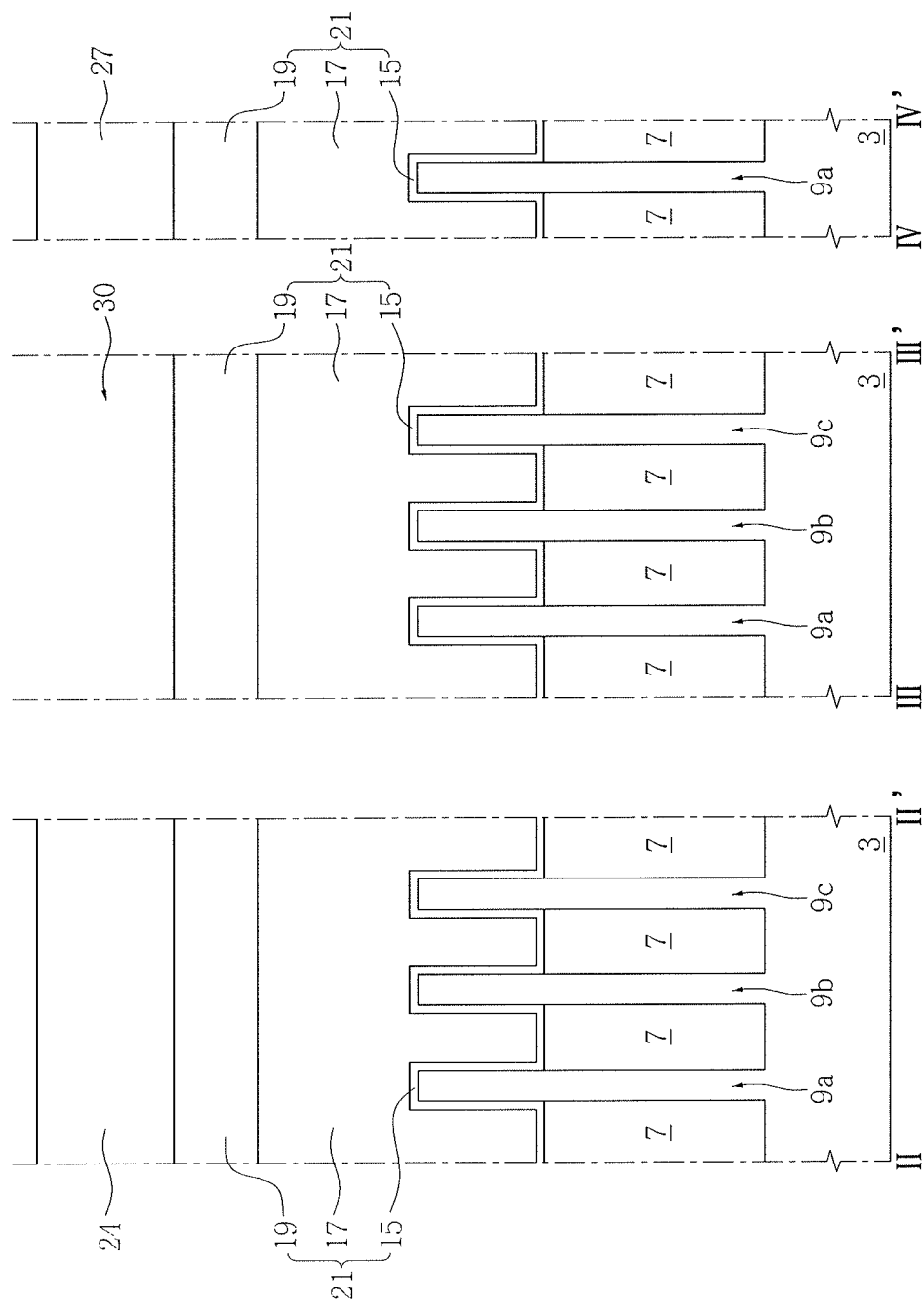
Figure 9:
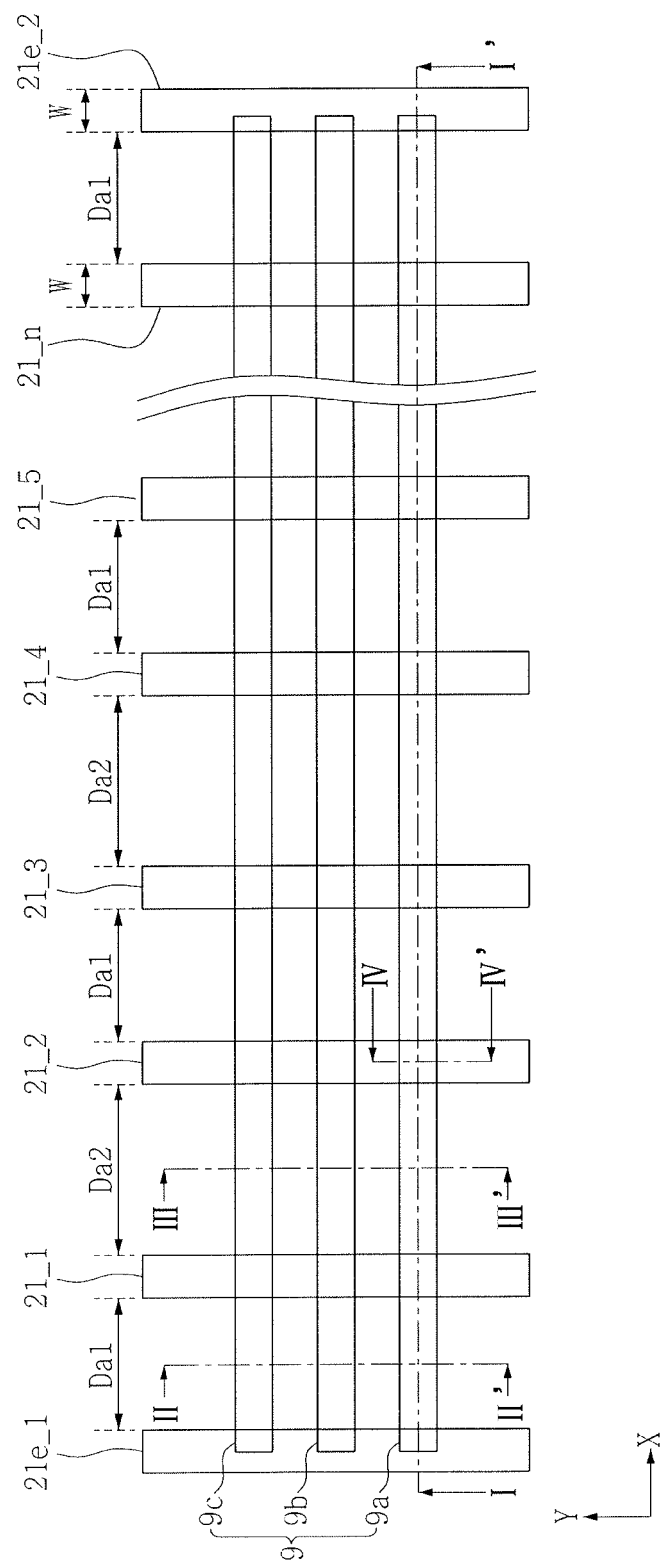
Figure 10A:
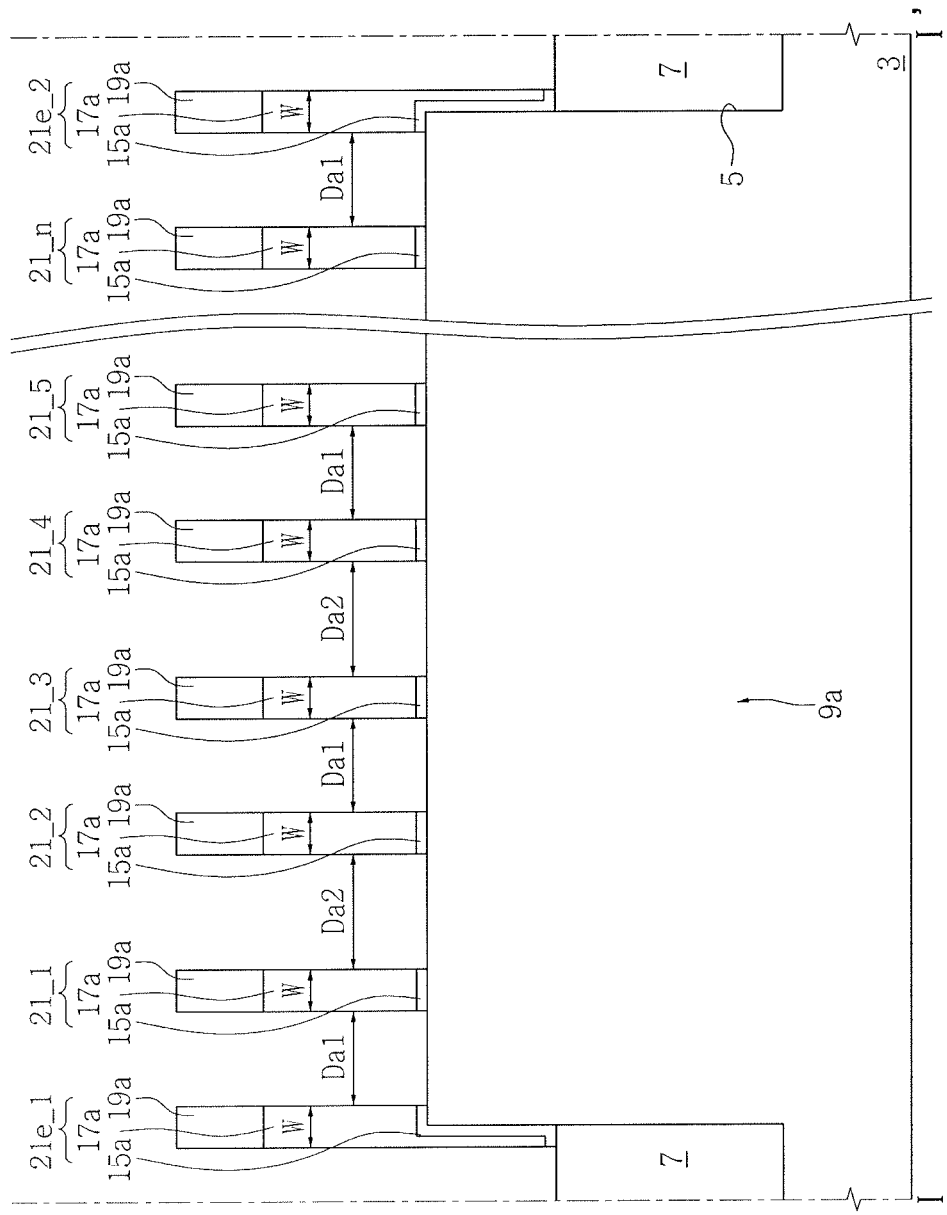
Figure 10B:
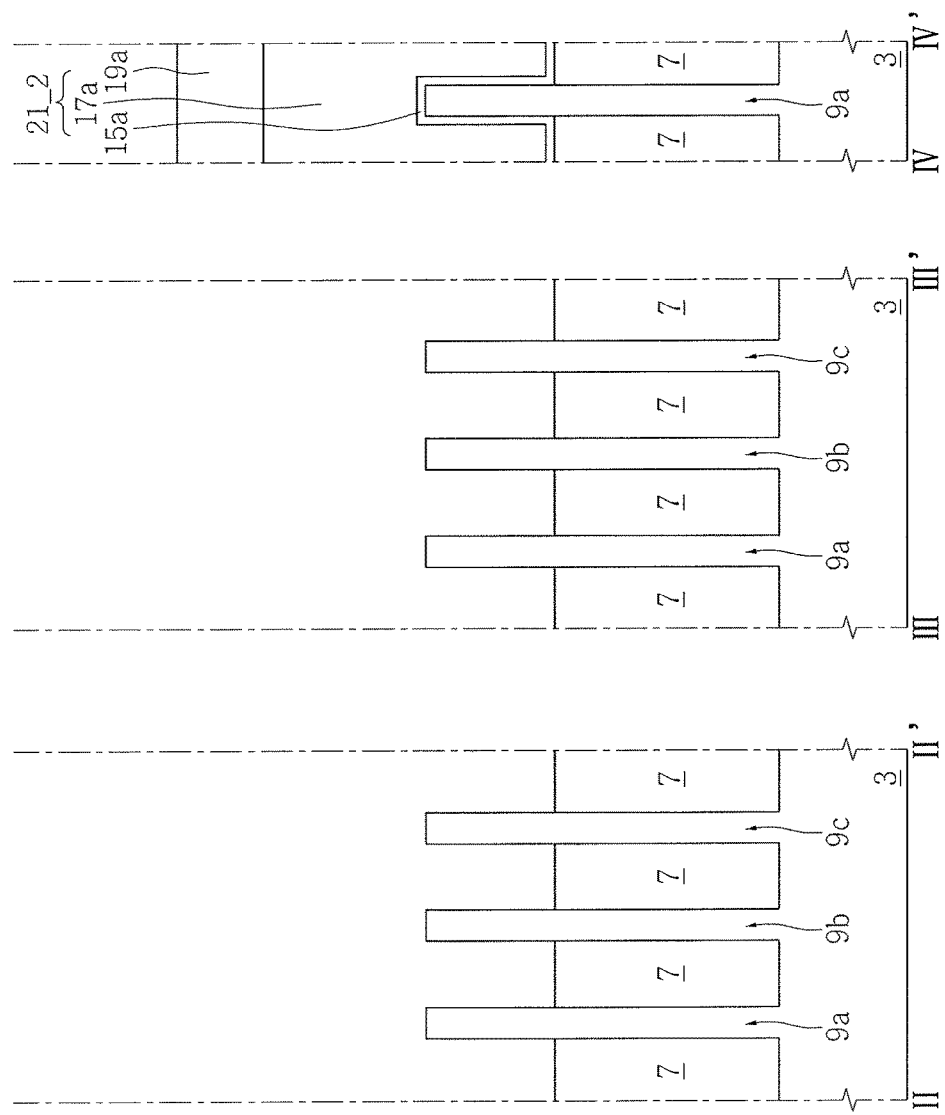
Figure 17B:
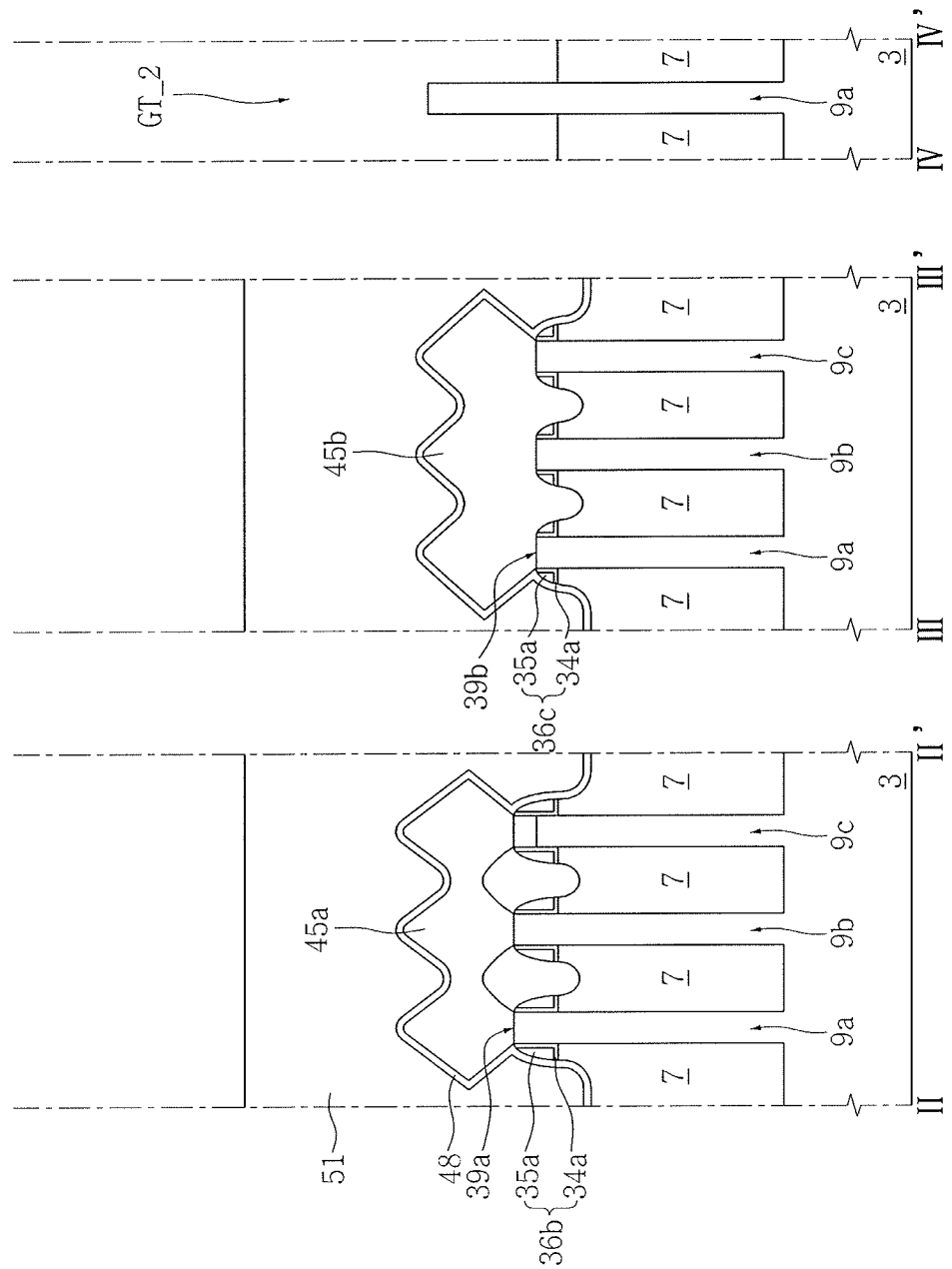
Figure 18A:
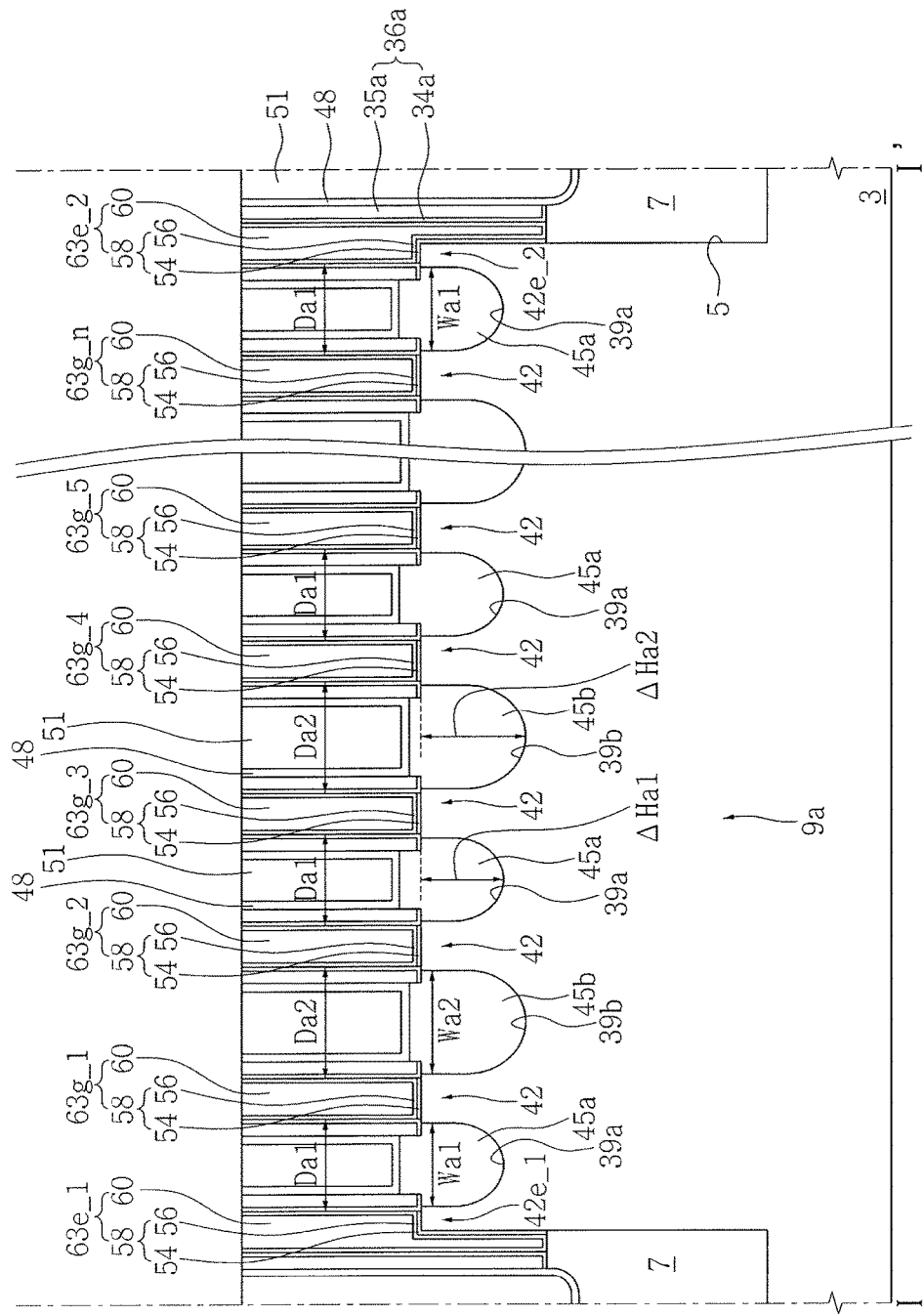

Specifically, FIG. 6A is a cross-sectional view taken along line I-I' in FIG. 5, and FIG. 6B is a cross-sectional view taken along line II-II', line III-III', and line IV-IV' in FIG. 5. FIG. 8A is a cross-sectional view taken along line I-I' in FIG. 7, and FIG. 8B is a cross-sectional view taken along line II-II', line III-III', and line IV-IV' in FIG. 7. FIG. 10A is a cross-sectional view taken along line I-I' in FIG. 9, and FIG. 10B is a cross-sectional view taken along line II-II', line III-III', and line IV-IV' in FIG. 9. FIGS. 12A, 13A, and 14A are cross-sectional views taken along line I-I' in FIG. 11, and FIGS. 12b, 13b, and 14b are cross-sectional views taken along line II-II', line III-III', and line IV-IV' in FIG. 1.1 FIGS. 16A, 17A, and 18A are cross-sectional views taken along line I-I' of FIG. 15, and FIGS. 16B, 17B, and 18B are cross-sectional views taken along line II-II', line III-III', and line IV-IV' in FIG. 15.

Referring to FIGS. 5, 6A, and 6B, according to one embodiment, the method for forming a semiconductor device includes forming isolation regions 7 defining a plurality of active regions 9 in a semiconductor substrate 3. The method may also include forming a sacrificial layer 21 and forming a plurality of mask patterns 24 on sacrificial layer 21. The isolation region 7 may be a trench isolation region. An upper surface of the isolation region 7 may be at a lower level than upper surfaces of the active regions 9. Upper portions of the active regions 9 may protrude to higher levels than the upper surface of the isolation region 7.

Forming the isolation region 7 may include forming a device isolation trench 5 to define the active regions 9 in the semiconductor substrate 3, and forming an insulating material layer to partially fill the device isolation trench 5. The active regions 9 may have line shapes extending in a first direction (e.g., X direction). The active regions 9 may include a first active region 9a, a second active region 9b, and a third active region 9c parallel to each other and sequentially arranged in a second direction (e.g., Y direction) perpendicular to the first direction (X direction).

Forming the sacrificial layer 21 may include forming a base insulating layer 15 to conformally cover the active regions 9 and the isolation region 7, forming a lower sacrificial layer 17 on the base insulating layer 15, and forming an upper sacrificial layer 19 on the lower sacrificial layer 17. The base insulating layer 15 may be formed, for example, of silicon oxide. The lower sacrificial layer 17 may be formed, for example, of polysilicon and the upper sacrificial layer 19 may be formed of a material such as but not limited to silicon nitride.

The mask patterns 24 may be formed on the upper sacrificial layer 19 and may be formed of a material (e.g., polysilicon) having an etch selectivity with respect to the upper sacrificial layer 19. The mask patterns 24 may cross the active regions 9 and extend onto the isolation region 7. Each of the mask patterns 24 may have a predetermined (e.g., long bar or line) shape in the second direction (Y direction). The mask patterns 24 may be sequentially arranged in the first direction (X direction). Each width Da1 of the mask patterns 24 may be less than an interval S between the mask patterns 24.

Referring to FIGS. 7, 8a, and 8b, according to one embodiment, the method include forming spacers 27 on side surfaces of the mask patterns 24. The spacers 27 may be formed of a material having an etch selectivity with respect to the mask patterns 24. Each of the separation distances S between the mask patterns 24 may be a sum of twice a width W of the spacer 27 and a width Da2 of empty spaces 30 between mask patterns 24.

In one embodiment, widths Da2 of the empty spaces 30 may be greater than widths Da1 of the mask patterns 24. As described above, the widths Da2 of the empty spaces 30 and the widths Da1 of the mask patterns 24 may determine separation distances between the patterns 63e_1, 630 to 63g_n, and 63e_2 in a structure of the semiconductor device described in FIGS. 1, 2A, and 2B. In one embodiment, widths Da1 of the mask patterns 24 and separation distances S between the mask patterns 24 may be adjusted and separation distances between the patterns 163e_1, 163g_1 to 163g_n, and 163e_2 may be determined for a structure of the semiconductor device described in FIGS. 3, 4A, and 4B. For example, the widths Da2 of the empty spaces 30 may be less than the widths Da1 of the mask patterns 24, and separation distances between the patterns 163e_1, 163g_1 to 163g_n, and 163e_2 may be determined for a structure of the semiconductor device described in FIGS. 3, 4A, and 4B.

Referring to FIGS. 9, 10A, and 10B, the method may include using the spacers 27 (FIGS. 7, 8A, and 8B) as etch masks, etching and removing the mask patterns 24 (FIGS. 7, 8A, and 8B), etching the sacrificial layer 21, and forming a plurality of sacrificial patterns.

In one embodiment, before or after etching and removal of the mask patterns 24, edges of the spacers 27 may be etched using a photolithography and etching process. The spacers 27 may be formed to have, for example, long bar or line shapes.

The sacrificial patterns may include a first edge sacrificial pattern 21e_1, a plurality of gate sacrificial patterns 21_1 to 21_n, and a second edge sacrificial pattern 21e_2 sequentially arranged in the first direction (X direction). Each of the sacrificial patterns may include a base insulating pattern 15a, a lower sacrificial pattern 17a, and an upper sacrificial pattern 19a, which are sequentially stacked.

Spaces between the sacrificial patterns may be determined by widths Da2 of the empty spaces 30 (FIGS. 7, 8A, and 8B) and widths Da1 of the mask patterns 24. Each width of the sacrificial patterns may be determined, for example, by the spacers 27. In one embodiment, the spacers 27 may be etched and removed while forming the sacrificial patterns.

Figure 11:
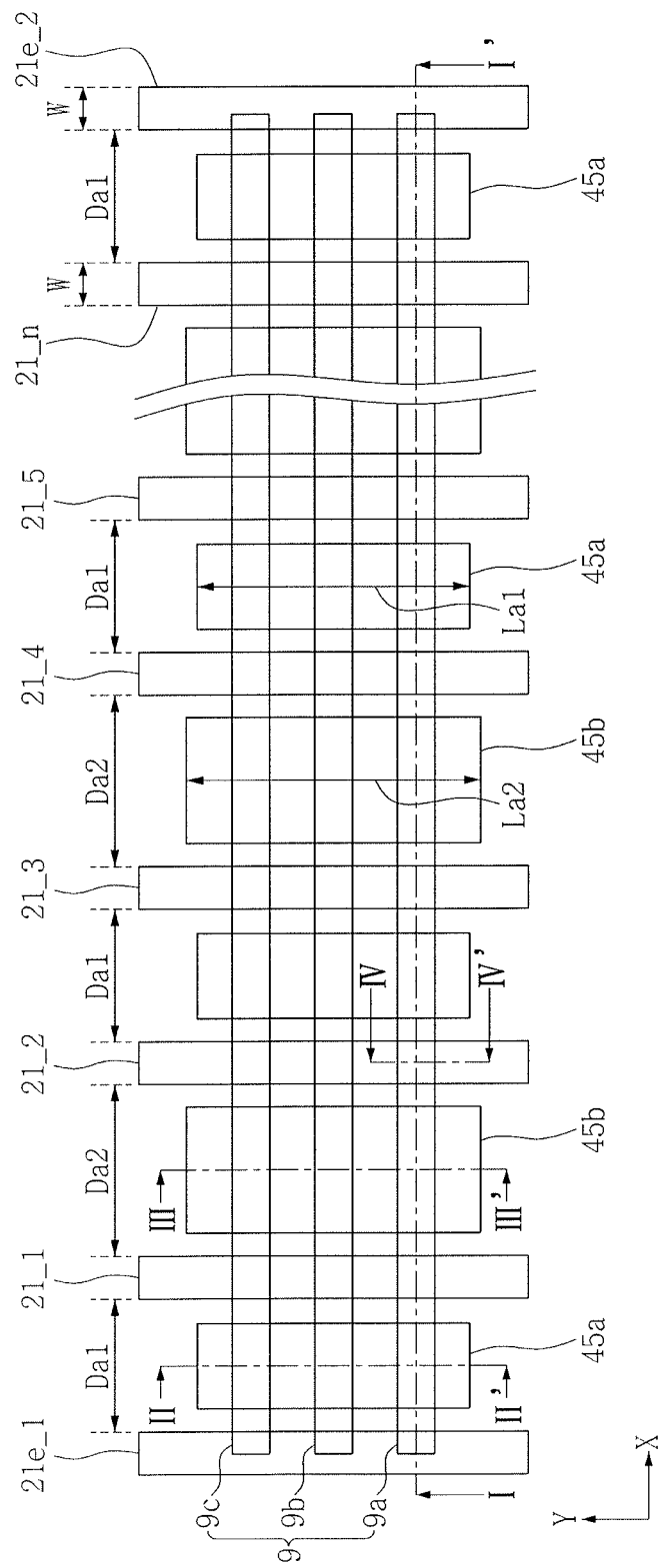
Figure 12A:
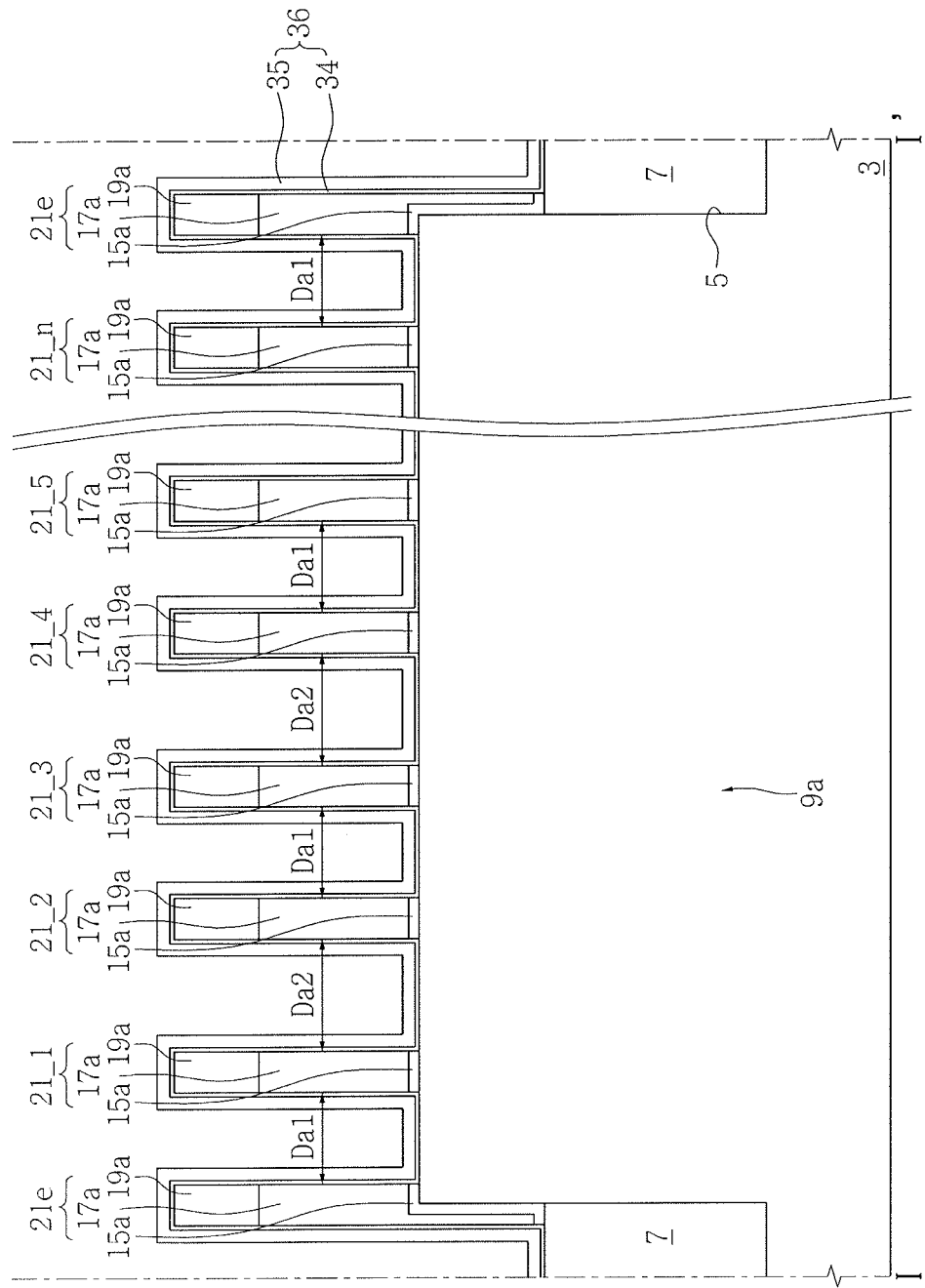
Figure 12B:
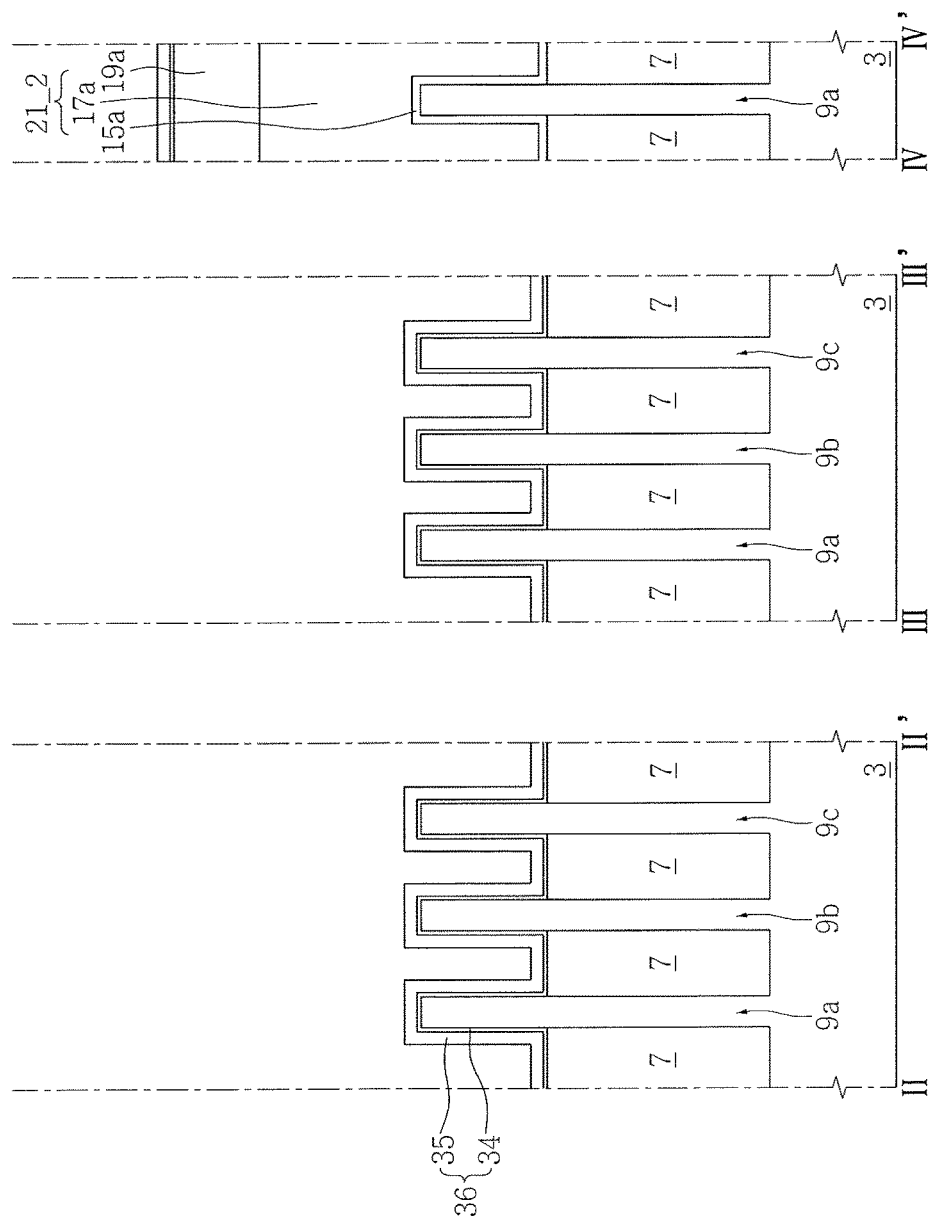
Figure 13A:
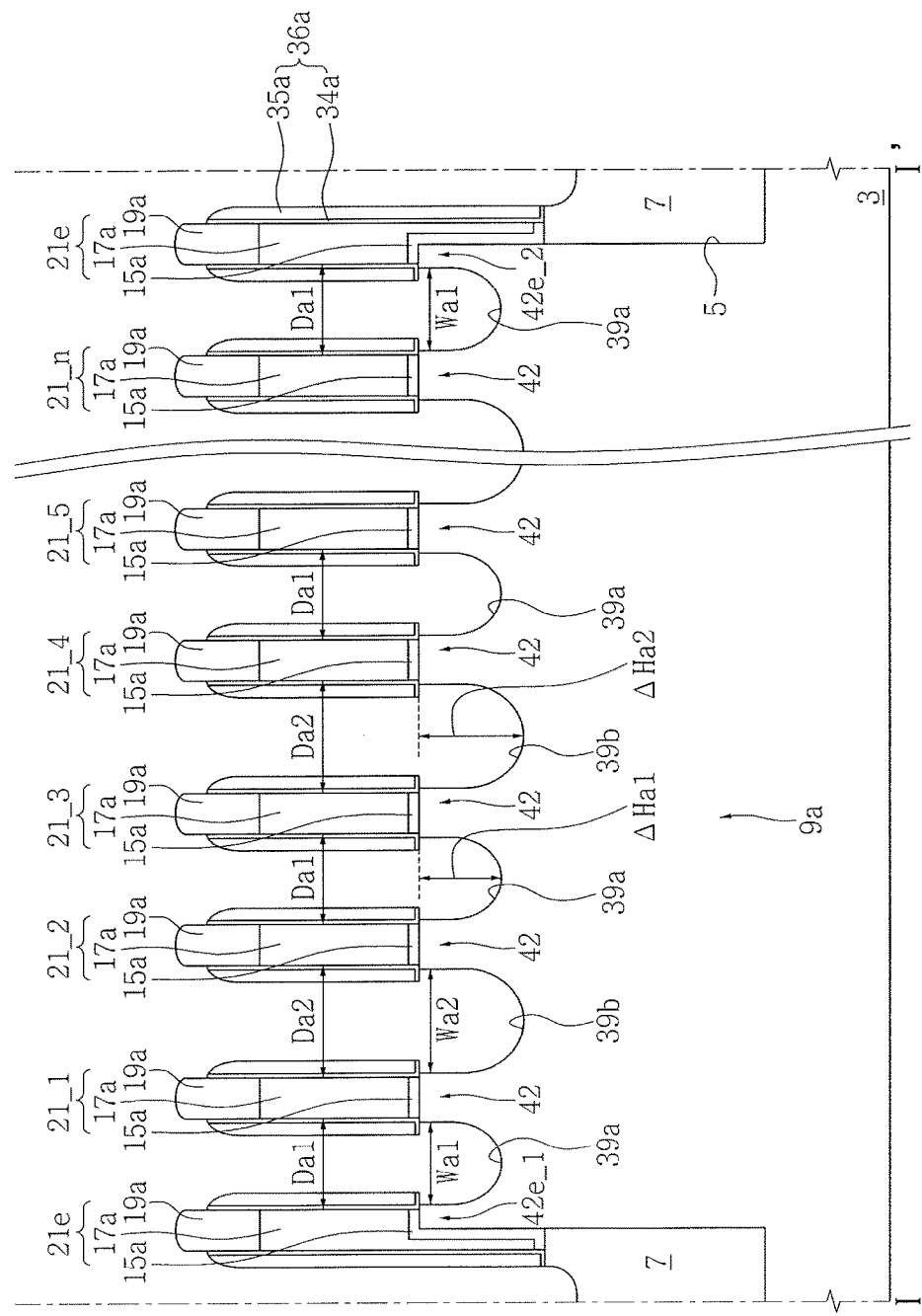

Referring to FIGS. 11, 12A, and 12B, according to one embodiment, the method may include forming an insulating spacer layer 36 on a substrate having the sacrificial patterns 21e_1, 21_1 to 21_n, and 21e_2. The insulating spacer layer 36 may include an inner spacer layer 34 and an outer spacer layer 35 on the inner spacer layer 34. The inner spacer layer 34 may be formed of a material having a different etch selectivity from the outer spacer layer 35. For example, the inner spacer layer 34 may be formed of an insulating nitride (e.g., silicon nitride), and the outer spacer layer 35 may be formed of an insulating oxide (e.g., silicon oxide or silicon oxide containing carbon (SiOC)).

Figure 13B:
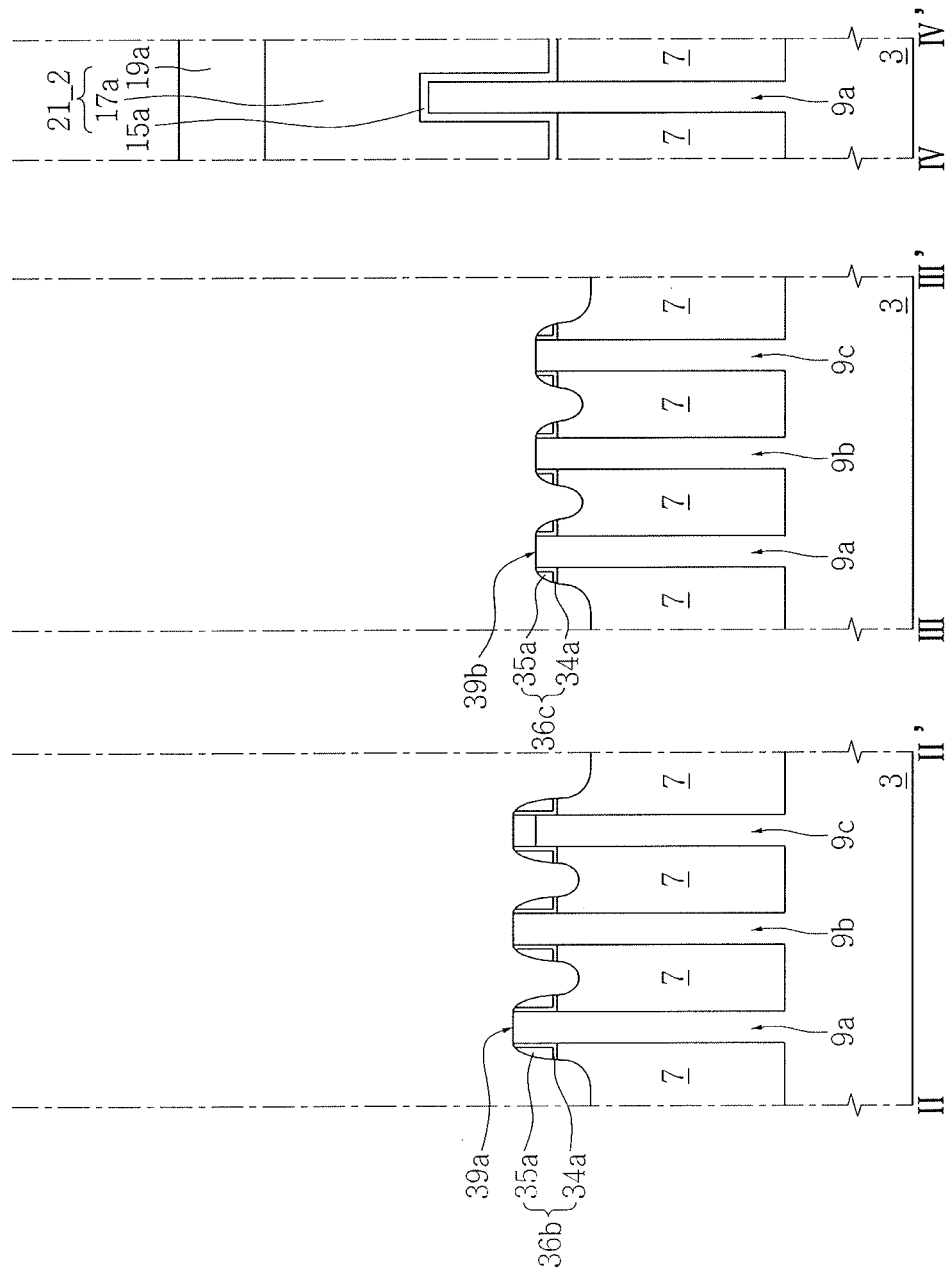
Figure 14A:
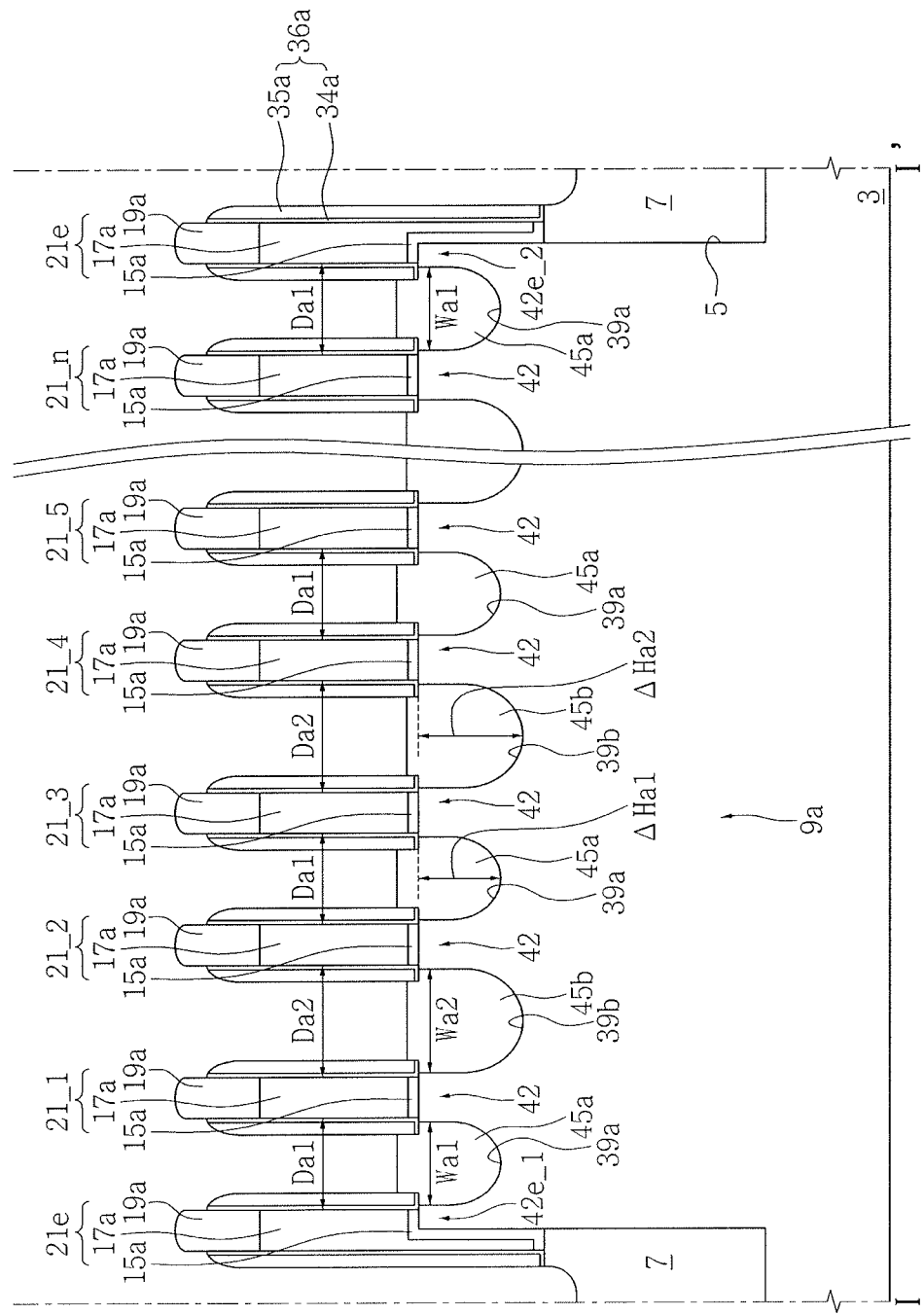

Referring to FIGS. 11, 13A, and 13B, according to one embodiment, the method may include sequentially etching the spacer layer 34 and the active regions 9. The active regions 9 may be etched and first recessed areas 39a and second recessed areas 39b may be formed. The first recessed areas 39a may have widths and depths less than the second recessed areas 39b. Each of the first recessed areas 39a may have a first depth ΔHa1, and each of the second recessed areas 39b may include a second depth ΔHa2 having a greater depth than the first depth ΔHa1. Each of the first recessed areas 39a may have a first width Wa1, and each of the second recessed areas 39b may include a second width Wa2 having a greater width than the first width Wa1.

The first recessed areas 39a may be formed in the active region between the sacrificial patterns 21e_1, 21_1 to 21_n, and 21e_2 spaced apart by the first interval Da1. The second recessed areas 39b may be formed in the active region between the sacrificial patterns 21e_1, 21_1 to 21_n, and 21e_2 spaced apart by the second interval Da2. The first recessed areas 39a may be formed in an odd-numbered sequence, and the second recessed areas 39b may be formed in an even-numbered sequence. Each of the second recessed areas 39b may be formed between a pair of adjacent first recessed areas 39a.

The insulating spacer layer 36 may be etched, and gate spacers 36a, first active spacers 36b, and second active spacers 36c may be formed. Each of the gate spacers 36a, the first active spacers 36b, and the second active spacers 36c may include an inner spacer 34a and an outer spacer 35a on the inner spacer 34a.

The gate spacers 36a may be formed on side surfaces of the sacrificial patterns 21e_1, 21_1 to 21_n, and 21e_2.

The first active spacers 36b may be formed on side surfaces of the active regions 9 located under the first recessed areas 39a. The second active spacers 36c may be formed on side surfaces of the active regions 9 located under the second recessed areas 39b.

Figure 14B:
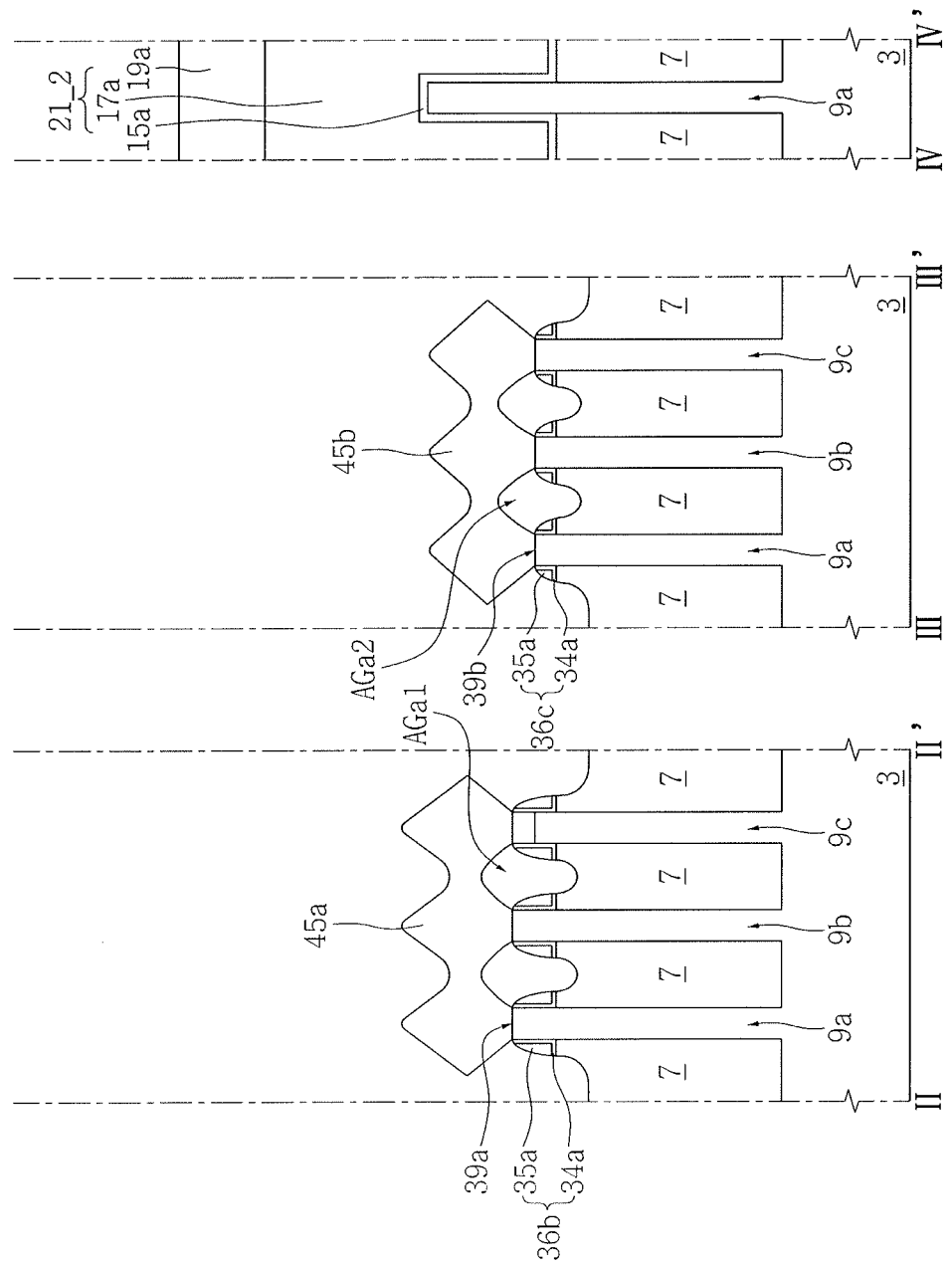

Referring to FIGS. 11, 14A, and 14B, according to one embodiment, the method may include forming a plurality of semiconductor structures 45a and 45b in the recessed areas 39a and 39b. The semiconductor structures 45a and 45b may be epitaxial layers formed, for example, by performing a selective epitaxial growth (SEG) process.

In one embodiment, the semiconductor structures 45a and 45b may be formed to have conductivity types different from the active regions 9. The semiconductor structures 45a and 45b may be formed of a different material from the active regions 9 or a material having a different composition ratio from the active regions 9. For example, the semiconductor structures 45a and 45b may have a material (e.g., silicon germanium) and the active regions 9 may have a material, e.g., silicon.

The semiconductor structures 45a and 45b may include first semiconductor structures 45a and second semiconductor structures 45b. The first semiconductor structures 45a may be formed in the first recessed areas 39a. The second semiconductor structures 45b may be formed in the second recessed areas 39b. The first semiconductor structures 45a may fill the first recessed areas 39a. The second semiconductor structures 45b may fill the second recessed areas 39b. Upper surfaces of the first semiconductor structures 45a may be formed at higher levels than upper surfaces of the active protruding portions 42. Upper surfaces of the second semiconductor structures 45b may be formed at higher levels than the upper surfaces of the active protruding portions 42.

The first semiconductor structures 45a may be formed to have upper surfaces at levels different from the upper surfaces of the second semiconductor structures 45b. The first semiconductor structures 45a may have the upper surfaces at higher levels than the upper surfaces of the second semiconductor structures 45b.

In a plan view, each of the first semiconductor structures 45a may be formed in a predetermined (e.g., bar) shape and to overlap the active regions 9. For example, each of the first semiconductor structures 45a may overlap the first to third active regions 9a, 9b, and 9c.

In a plan view, each of the second semiconductor structures 45b may be formed in a predetermined (e.g., bar) shape and to overlap the active regions 9. For example, each of the second semiconductor structures 45b may overlap the first to third active regions 9a, 9b, and 9c.

The first semiconductor structures 45a may have shapes with widths and lengths less than those of the second semiconductor structures 45b. The first semiconductor structures 45a may have horizontal widths and vertical lengths less than the second semiconductor structures 45b. Widths Wa1 of the first semiconductor structures 45a in the first direction (X direction) may be less than widths Wa2 of the second semiconductor structures 45b in the first direction (X direction). Lengths La1 of the first semiconductor structures 45a in the second direction (Y direction) may be less than lengths La2 of the second semiconductor structures 45b in the second direction (Y direction).

As the semiconductor structures 45a and 45b are formed, a plurality of first air gaps AGa1 may be formed between the first semiconductor structures 45a and the isolation region 7 located between the active regions 9. A plurality of second air gaps AGa2 may be formed between the first semiconductor structures 45b and the isolation region 7 located between the active regions 9. The first and the second air gaps AGa1 and AGa2 may be empty spaces.

Figure 15:
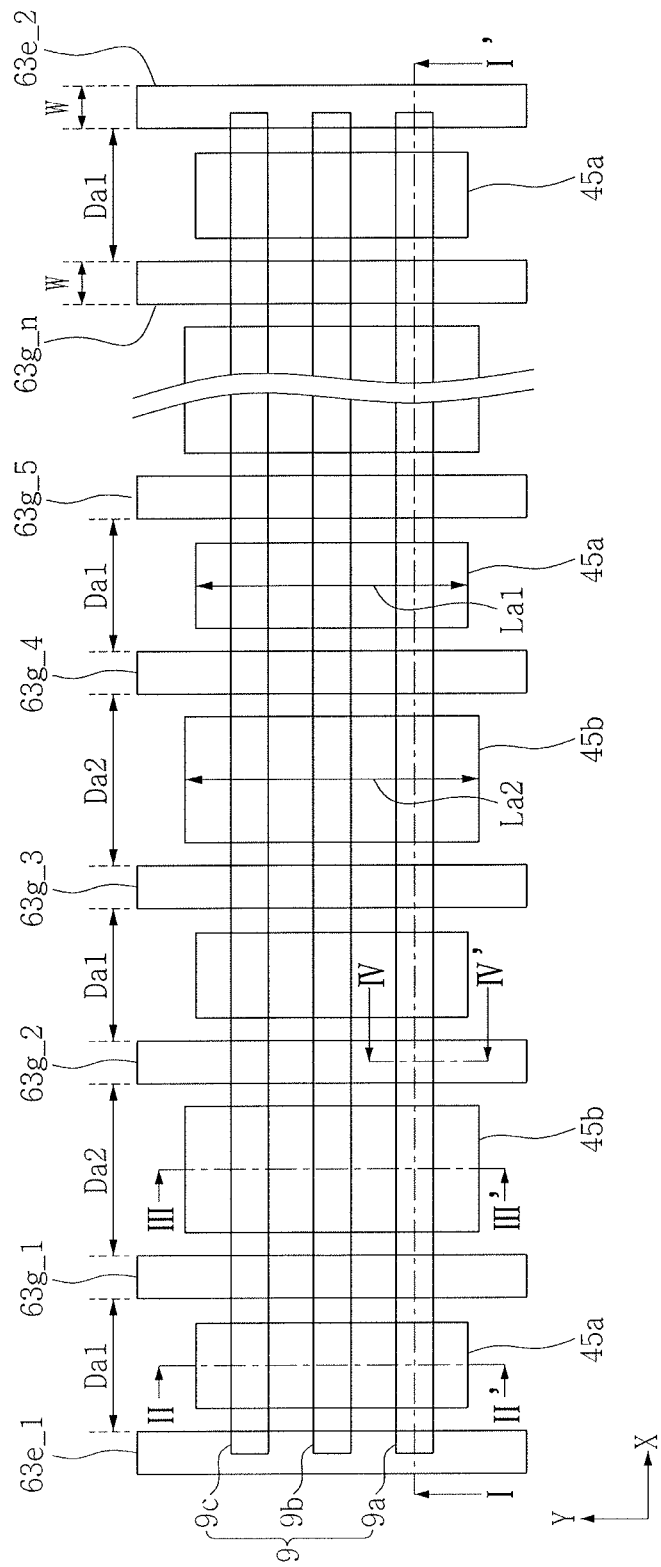
Figure 16A:
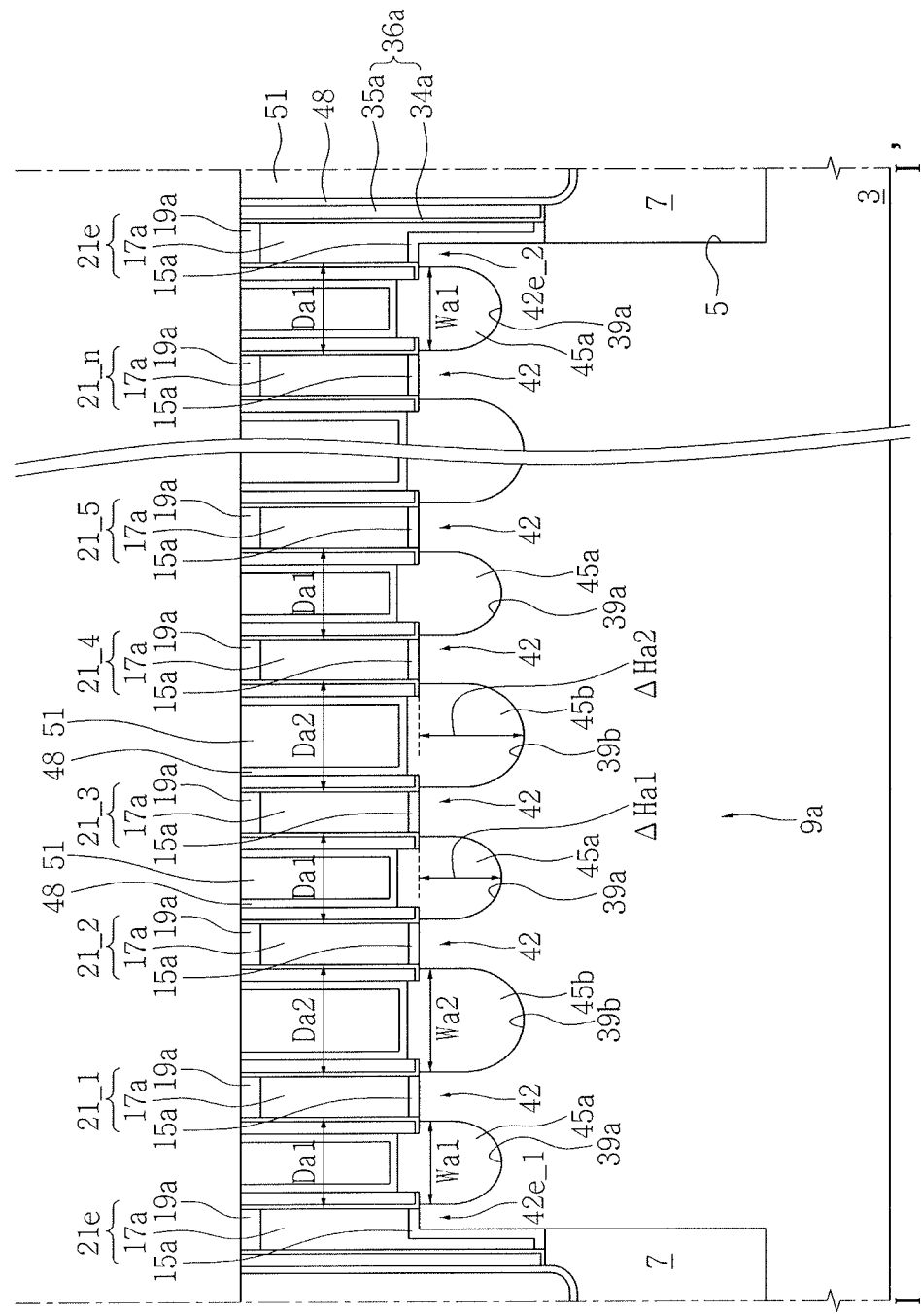
Figure 16B:
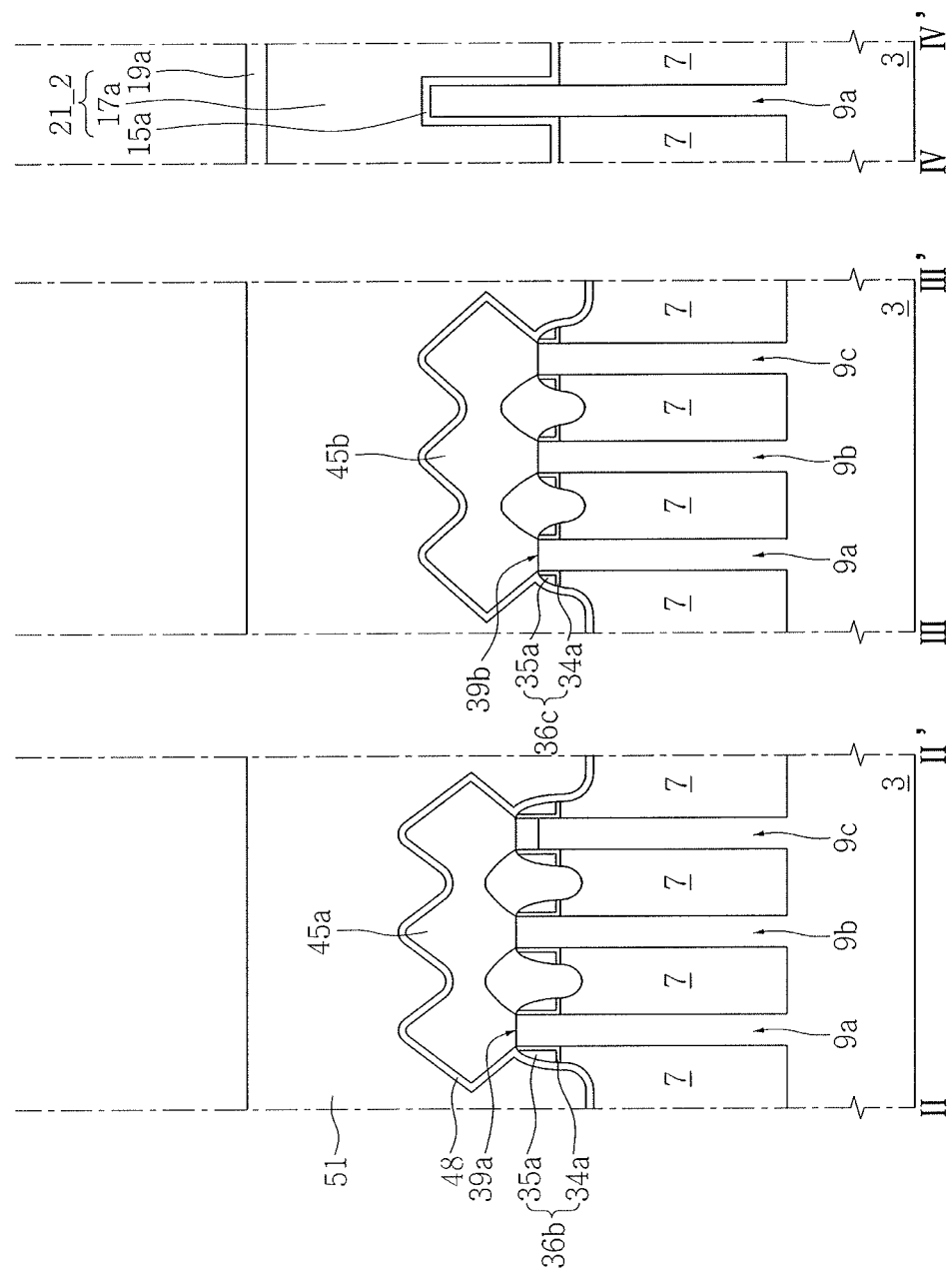

Referring to FIGS. 15, 16A, and 16B, according to an embodiment, the method may include conformally forming an insulating stopper layer 48 on a substrate having the semiconductor structures 45a and 45b, forming a lower interlayer insulating layer 51 on the insulating stopper layer 48, and planarizing the insulating stopper layer 48 and the lower interlayer insulating layer 51 until the sacrificial patterns 21e_1, 21_1 to 21_n, and 21e_2 are exposed. The insulating stopper layer 48 may be formed of an insulating material which includes, for example, silicon nitride. The lower interlayer insulating layer 51 may be formed, for example, of a silicon oxide based insulating material.

Referring to FIGS. 15, 17A, and 17B, according to an embodiment, the method may include selectively etching the sacrificial patterns 21e_1, 21_1 to 21_n, and 21e_2 and forming a plurality of gate trenches GTe_1, GT_1 to GT_n, and GTe_2. The gate trenches GTe_1, GT_1 to GT_n, and GTe_2 may be formed by removing the sacrificial patterns 21e_1, 21_1 to 21_n, and 21e_2.

Figure 18B:
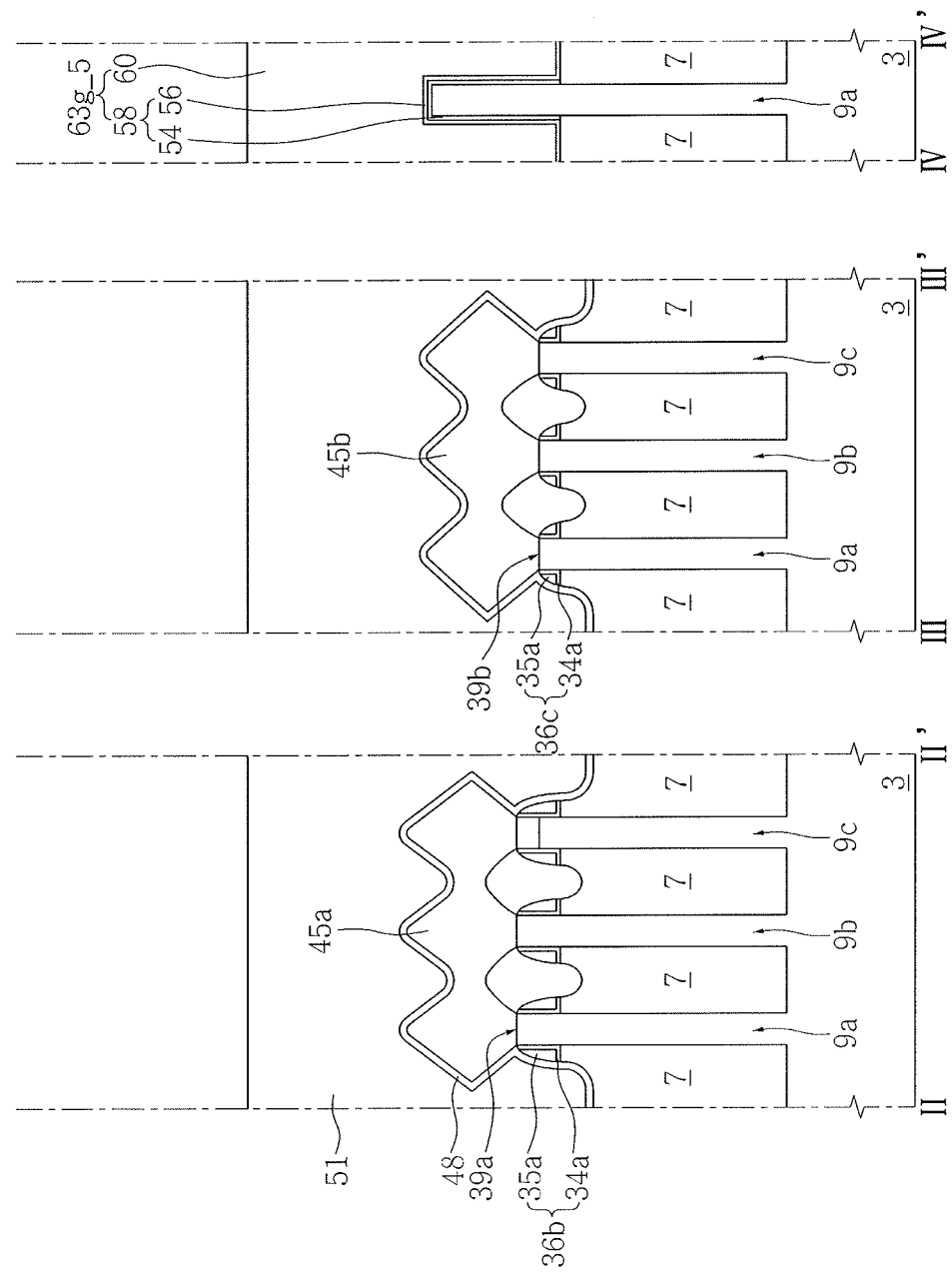

Referring to FIGS. 15, 18A, and 18B, according to an embodiment, the method may include forming a plurality of patterns 63e_1, 63g_1 to 63g_n, and 63e_2 configured to fill the gate trenches GTe_1, GT_1 to GT_n, and GTe_2. The patterns may include a first edge pattern 63e_1, a plurality of gate patterns 63g_1 to 63g_n, and a second edge pattern 63e_2 sequentially arranged in the first direction (X direction). The gate patterns 63g_1 to 63g_n may be formed between the first and the second edge patterns 63e_1 and 63e_2. The gate patterns 64g_1 to 63g_n may be any number n. In one embodiment, the number n may be an even number.

The patterns may include patterns spaced apart by a first interval Da1 and patterns spaced apart by a second interval Da2 which has a greater distance than the first interval Da1. The first edge pattern 63e_1 may be spaced apart from the gate patterns 63g_1 to 63g n by the first interval Da1. The second edge pattern 63e_2 may be spaced apart from the gate patterns 63g_1 to 63g_n by the first interval Da1.

Each of the patterns 63e_1, 63g_1 to 63g_n, and 63e_2 may include a conductive pattern 60 and a gate dielectric 58 on side surfaces and a bottom surface of the conductive pattern 60. The conductive pattern 60 may be a gate electrode. The gate dielectric 58 may include a first gate dielectric 54 formed by oxidizing the active regions 9 and a second gate dielectric 56 formed by performing a vapor deposition process. For example, the first gate dielectric 54 may be formed of silicon oxide and the second gate dielectric 56 may be formed of metal oxide.

Again, referring to FIGS. 1, 2A, and 2B, according to an embodiment, the method may include forming an upper interlayer insulating layer 66 on a substrate having the patterns 63e_1, 63g_1 to 63g_n, and 63e_2. The upper interlayer insulating layer 66 may be formed, for example, of a silicon oxide based insulating material.

According to one embodiment, the method may include forming contact holes passing through the upper interlayer insulating layer 66 and the lower interlayer insulating layer 51 and exposing the first semiconductor structures 45a and the second semiconductor structures 45b. The method may also include forming first silicide layers 69a on the first semiconductor structures 45a and second silicide layers 69b on the second semiconductor structures 45b by performing a silicide process, and forming first and second contact structures 72a and 72b to fill the contact holes.

Figure 19A:
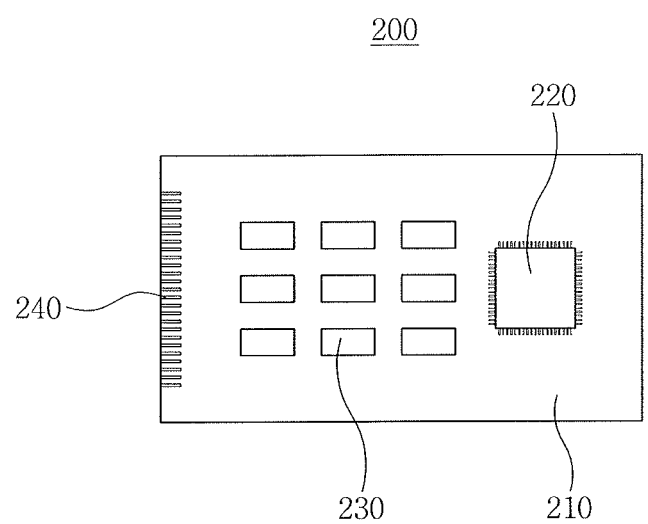
FIG. 19A illustrates an embodiment of a semiconductor module.

FIG. 19A illustrates an embodiment of a semiconductor module 200 which includes a processor 220 and memory devices 230 mounted on a module substrate 210. Conductive input/output terminals 240 may be on at least one side of the module substrate 210. The processor 220 or the memory devices 230 may include the semiconductor device according to embodiments.

Figure 19B:
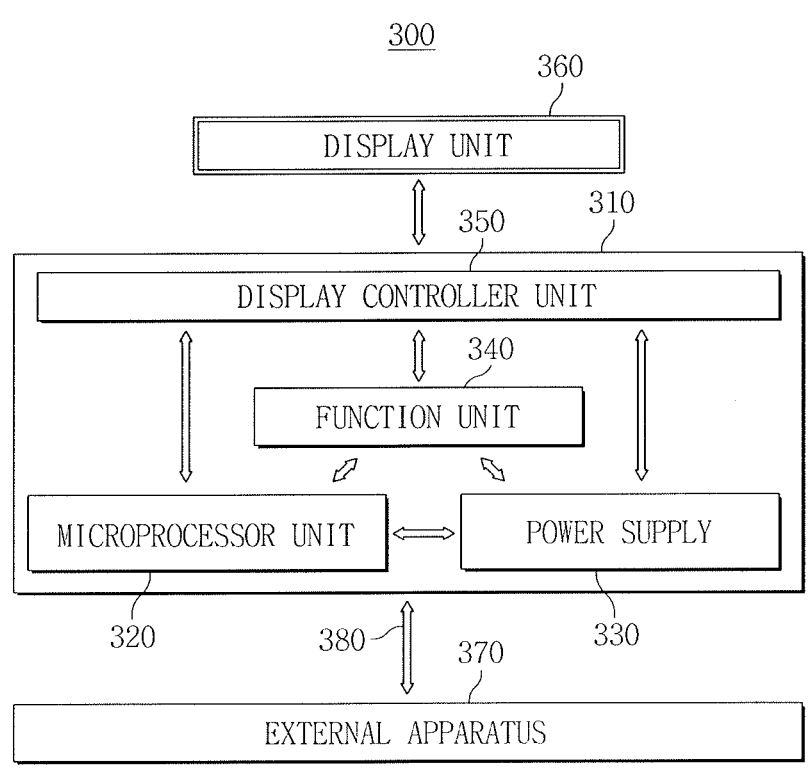
FIGS. 19B and 19C illustrate block illustrating embodiments of an electronic system.
Figure 19C:
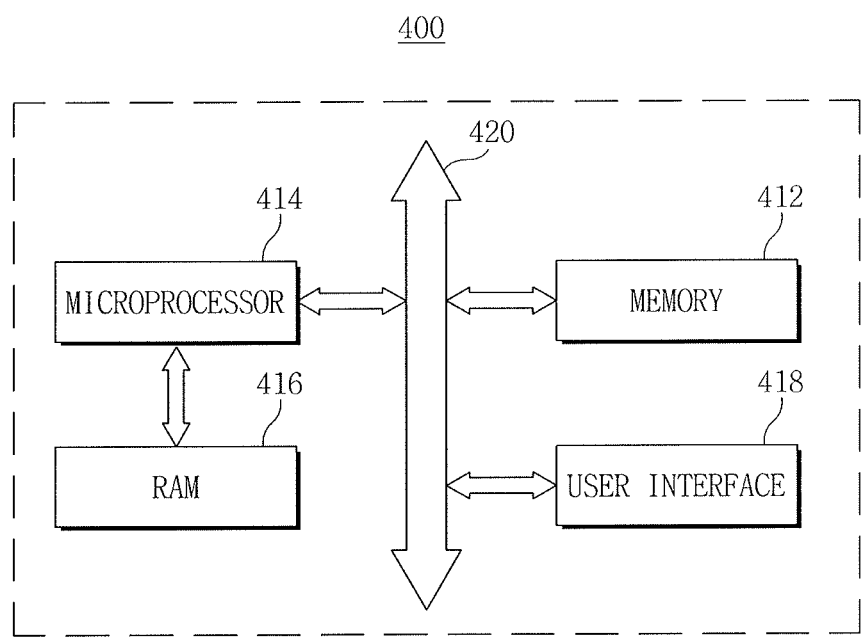

FIGS. 19B and 19C illustrates an embodiment of an electronic system.

Referring to FIG. 19B, the electronic system 300 may include a body 310, a display unit 360, and an external apparatus 370. The body 310 may include a microprocessor unit 320, a power supply 330, a function unit 340, and/or a display control unit 350. The body 310 may include a system board or a motherboard having a PCB, or the like, and/or a case. The microprocessor unit 320, the power supply 330, the function unit 340, and the display control unit 350 may be mounted or disposed on an upper surface of the body 310 or inside the body 310. The display unit 360 may be on the upper surface of the body 310 or inside/outside the body 310.

The display unit 360 may display an image processed by the display control unit 350. For example, the display unit 360 may include a liquid crystal display (LCD), active matrix organic light emitting diodes (AMOLED), or various display panels. The display unit 360 may include a touch screen. Therefore, the display unit 360 may have an input/output function. The power supply 330 may supply a current or voltage to the microprocessor unit 320, the function unit 340, the display control unit 350, etc. The power supply 330 may include a charging battery, a socket for a dry cell, or a voltage/current converter.

The microprocessor unit 320 may receive a voltage from the power supply 330 to control the function unit 340 and the display unit 360. For example, the microprocessor unit 320 may include a central processing unit (CPU) or an application processor (AP). The function unit 340 may perform various functions. For example, the function unit 340 may include a touch pad, a touch screen, a volatile/non-volatile memory, a memory card controller, a camera, a lighting, an audio and moving picture reproducing processor, a wireless radio antenna, a speaker, a microphone, a Universal Serial Bus (USB) port, or a unit having other various functions.

The microprocessor unit 320 or the function unit 340 may include the semiconductor device according to one or more of the aforementioned embodiments.

Referring to FIG. 19C, an electronic system 400 includes a microprocessor 414, a memory 412, and a user interface 418 which perform data communication using a bus 420. The microprocessor 414 may include a CPU or AP. The electronic system 400 may further include a RAM 416 to directly communicate with the microprocessor 414. The microprocessor 414 and/or the RAM 416 may be assembled within a single package.

The user interface 418 may be used to input data to the electronic system 400, or output data from the electronic system 400. For example, user interface 418 may include a touch pad, a touch screen, a keyboard, a mouse, a voice detector, a cathode ray tube (CRT) monitor, an LCD, an AMOLED, a plasma display pad (PDP), a printer, a lighting, or various input/output devices.

The memory 412 may store operational codes of the microprocessor 414, data processed by the microprocessor 414, or data received from the outside. The memory 412 may include a memory controller, a hard disk, or a solid state drive (SSD). The microprocessor 414, RAM 416, and/or memory 412 may include the semiconductor device according to one or more of the aforementioned embodiments.

One or more of the aforementioned embodiments provide a transistor having a finFET structure and a variety of gate and semiconductor structures. The semiconductor structures may be formed as epitaxial layers in recessed areas of an active region using a SEG process. The recessed areas of the active region may be adjacent to each other and formed to have different depths from each other. Recessed areas having different depths from each other may be at both sides of a protruding portion of an active region in which a channel region of the transistor may be defined. The semiconductor structures serving as a source/drain and capable of improving carrier mobility characteristics in a channel region of the transistor may be in the recessed areas. Thus, a semiconductor device including the transistor may be provided having improved carrier mobility characteristics.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments as set forth in the following claims.

What is claimed is:

1. A semiconductor device, comprising:
an isolation region to define an active region in a semiconductor substrate, the active region including a plurality of protruding portions and a plurality of recessed areas;
a plurality of patterns overlapping the plurality of protruding portions of the active region and having substantially a same width; and
a plurality of semiconductor structures in the plurality of recessed areas,
wherein the plurality of recessed areas include first recessed areas in an odd-numbered sequence and second recessed areas in an even-numbered sequence, and wherein the first recessed areas and the second recessed areas are adjacent to each other and have different depths and different widths corresponding to different spacings between the patterns.

2. The semiconductor device as claimed in claim 1, wherein the plurality of semiconductor structures include a first semiconductor structure and a second semiconductor structure which are adjacent to each other,
wherein a width of the first semiconductor structure is less than a width of the second semiconductor structure, and
wherein the height difference between the bottom surface of the first semiconductor structure and the upper surface of at least one of the protruding portions is less than the height difference between the bottom surface of the second semiconductor structure and the upper surface of at least one of the protruding portions.

3. The semiconductor device as claimed in claim 2, wherein the first and second semiconductor structures overlap the isolation region.

4. The semiconductor device as claimed in claim 3, further comprising:
a first air gap between the first semiconductor structure and the isolation region; and
a second air gap between the second semiconductor structure and the isolation region.

5. The semiconductor device as claimed in claim 2, wherein a length of the first semiconductor structure is less than a length of the second semiconductor.

6. The semiconductor device as claimed in claim 1, wherein the plurality of semiconductor structures are epitaxial layers having a conductivity type different from the active regions.

7. The semiconductor device as claimed in claim 1, wherein the protruding portions include a first edge protruding portion, a second edge protruding portion, and a plurality of active protruding portions between the first and the second edge protruding portions.

8. The semiconductor device as claimed in claim 7, wherein widths of the first and the second edge protruding portions are less than widths of the active protruding portions.

9. The semiconductor device as claimed in claim 7, wherein the plurality of patterns include a first edge pattern, a second edge pattern, and a plurality of gate patterns between the first and second edge patterns,
wherein the first edge pattern overlaps the first edge protruding portion,
wherein the second edge pattern overlaps the second edge protruding portion, and
wherein the plurality of gate patterns overlap the active protruding portions.

10. The semiconductor device as claimed in claim 9, wherein widths of the first and the second edge patterns are greater than widths of the first and the second edge protruding portions.

11. A semiconductor device, comprising:
an active region in a semiconductor substrate and including a plurality of protruding portions and a plurality of recessed areas;
a plurality of patterns overlapping the protruding portions of the active region and having substantially a same width; and
a plurality of semiconductor structures in the recessed areas, wherein:
the recessed areas include a first recessed area and a second recessed area which are adjacent to each other and have different depths, and
the plurality of semiconductor structures include a first semiconductor structure in the first recessed area and a second semiconductor structure in the second recessed area and having a different width from the first semiconductor structure.

12. The semiconductor device as claimed in claim 11, wherein a depth of the second recessed area is greater than a depth of the first recessed area.

13. The semiconductor device as claimed in claim 12, wherein a width of the second recessed area is greater than a width of the first recessed area.

14. The semiconductor device as claimed in claim 11, wherein:
the plurality of protruding portions include a first edge protruding portion, a plurality of active protruding portions, and a second edge protruding portion, which are sequentially arranged in a first direction; and
the plurality of patterns include a first edge pattern overlapping the first edge protruding portion, a plurality of gate patterns overlapping the plurality of active protruding portions, and a second edge pattern overlapping the second edge pattern.

15. The semiconductor device as claimed in claim 11, wherein:
   the first semiconductor structure contacts the first recessed area and fills the first recessed area;
   the second semiconductor structure contacts the second recessed area and fills the second recessed area; and
   an upper surface of the first semiconductor structure is at a different level from an upper surface of the second semiconductor structure.

16. A semiconductor device, comprising:
   a first, second, and third active regions;
   a first pattern on the first active region;
   a second pattern on the second active region; and
   a third pattern on the third active region, wherein the first pattern is spaced from the second pattern by a first interval that substantially corresponds to a width of a first recess between the first and second active regions, and wherein the second pattern is spaced from the third pattern by a second interval that substantially corresponds to a width of a second recess between the second and third active regions, the first interval different from the second interval,
   wherein the first, second, and third patterns includes gate patterns, and wherein the first and second recesses include a semiconductor material having a conductivity type different from the first, second, and third active regions.

17. The semiconductor device as claimed in claim 16, wherein the first, second, and third patterns have substantially a same width.

18. The semiconductor device as claimed in claim 16, wherein the first and second recesses have different depths.

19. The semiconductor device as claimed in claim 16, wherein the semiconductor material in one of the first or second recesses extends higher than the semiconductor material in the other of the first or second recesses.

20. The semiconductor device as claimed in claim 16, further comprising:
   an isolation region,
   wherein upper surfaces of the first, second, and third active regions are above an upper surface of the isolation region.

* * * * *